US011450762B2

(12) United States Patent
Shirakawa

(10) Patent No.: US 11,450,762 B2
(45) Date of Patent: Sep. 20, 2022

(54) SEMICONDUCTOR DEVICE

(71) Applicant: FUJI ELECTRIC CO., LTD., Kawasaki (JP)

(72) Inventor: Tohru Shirakawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/660,223

(22) Filed: Oct. 22, 2019

(65) Prior Publication Data

US 2020/0203512 A1 Jun. 25, 2020

(30) Foreign Application Priority Data

Dec. 19, 2018 (JP) ............................ JP2018-237070

(51) Int. Cl.
*H01L 29/739* (2006.01)
*H01L 29/06* (2006.01)
*H01L 29/66* (2006.01)

(52) U.S. Cl.
CPC ...... *H01L 29/7397* (2013.01); *H01L 29/0696* (2013.01); *H01L 29/66348* (2013.01)

(58) Field of Classification Search
CPC ............. H01L 29/7397; H01L 29/0696; H01L 29/66348; H01L 29/8613; H01L 29/417; H01L 29/407; H01L 29/4238; H01L 27/0823; H01L 29/0684; H01L 29/36
See application file for complete search history.

(56) References Cited

U.S. PATENT DOCUMENTS 5,329,142 A * 7/1994 Kitagawa ............ H01L 29/7394 257/137
10,600,897 B2 * 3/2020 Shirakawa .......... H01L 29/0619
10,847,641 B2 * 11/2020 Abe .................... H01L 29/4236
2003/0047778 A1 3/2003 Nakamura et al.
2009/0020852 A1 * 1/2009 Harada ............... H01L 29/7397 257/579
2016/0336404 A1 * 11/2016 Naito ................ H01L 29/42368
2017/0018547 A1 * 1/2017 Naito ................. H01L 27/0664
2017/0025522 A1 * 1/2017 Naito .................... H01L 29/407
2017/0236926 A1 * 8/2017 Imagawa ............ H01L 29/0696 257/144
2017/0301779 A1 * 10/2017 Naito ................. H01L 29/0834
2017/0352747 A1 * 12/2017 Sumitomo .......... H01L 27/0727
2018/0108737 A1 * 4/2018 Naito ................. H01L 29/1087

(Continued)

FOREIGN PATENT DOCUMENTS

JP 5025071 B2 9/2012
WO 2017/033315 A1 3/2017

*Primary Examiner* — Bitew A Dinke

(74) *Attorney, Agent, or Firm* — Rabin & Berdo, P.C.

(57) ABSTRACT

A semiconductor device is an IGBT of a trench-gate structure and has a storage region directly beneath a $p^-$-type base region. The semiconductor device has gate trenches and dummy trenches as trenches configuring the trench-gate structure. An interval (mesa width) at which the trenches are disposed is in a range of 0.7 μm to 2 μm. In each of the gate trenches, a gate electrode of a gate potential is provided via a first gate insulating film. In each of the dummy trenches, a dummy gate electrode of an emitter potential is provided via a second gate insulating film. A total number of the gate electrode is in a range of 60% to 84% of a total number of the dummy electrodes.

11 Claims, 19 Drawing Sheets

(56) References Cited

U.S. PATENT DOCUMENTS

| | | | | |
|---|---|---|---|---|
| 2018/0108738 | A1* | 4/2018 | Naito | H01L 29/1095 |
| 2018/0158815 | A1* | 6/2018 | Onozawa | H01L 21/266 |
| 2018/0204909 | A1 | 7/2018 | Konishi et al. | |

* cited by examiner

A1
A2
10
40
21
22
36a (36)
38a (38)
36b (36)
38b (38)
13
50
51
15
1
2
C1
C1'
C2
C2'
X
Y
Z

2
C1
C1'
43
(11)
39
41
42
50
13
31
44
45
46
21
24
37b38b
22
36b
(36)
37a38a
36a
(36)
23
51
p+
n-
n+
p+
G
E
d1
d3
10
X
Y
Z 2
43
(11)
41
39
31
44
45
46
X
Y
Z
G
C2'
15
52
21
37a38a
36a
(36)
p+
n-
n+
51
d1
d3
C2
10

(FIRST REFERENCE EXAMPLE: 50% GATE RATIO/WITH STORAGE REGION)

HOLE DENSITY [/cm$^3$]

$5.019\times10^{16}$
$2.303\times10^{15}$
$1.057\times10^{14}$
$4.848\times10^{12}$
$2.224\times10^{11}$
$1.020\times10^{10}$
$4.682\times10^{8}$ (FIRST EXAMPLE: 67% GATE RATIO/WITH STORAGE REGION)

HOLE DENSITY [/cm³]

$5.019\times10^{16}$
$2.303\times10^{15}$
$1.057\times10^{14}$
$4.848\times10^{12}$
$2.224\times10^{11}$
$1.020\times10^{10}$
$4.682\times10^{8}$

| STRUCTURAL COMPARISON | INTEGRAL VALUES OF HOLE DENSITY [/cm$^3$] |
|---|---|
| GATE RATIO100%: WITH STORAGE REGION | $3.80\times10^{18}$ |
| GATE RATIO100%: NO STORAGE REGION | $9.05\times10^{17}$ |
| GATE RATIO67%: WITH STORAGE REGION | $1.51\times10^{17}$ |
| GATE RATIO50%: WITH STORAGE REGION | $7.55\times10^{16}$ |

1
20'
43
(11)
39
34
32
33
41
42
40
33'
44
45
46
X
Y
Z
E
G
n+
p-
n
n-
p+
24
23
21
22
31
10
36b
(36)
37b
38b
36a
37a
38a 1
30
43
(11)
39
34
32
33
44
45
46
X
Y
Z
E
G
n+
p-
n
n-
p+
24
23
21
22
31
40
41
42
36a
(36)
37a
38a
36b
37b
38b
10

1
80
81
82
43
(11)
39
32
33
44
47
46
X
Y
Z
E
G
p-
n
n+
n-
p+
22
25
31
38b
37b
36b
(36)
23
38a
37a
36a
21
24
45
41
42
40
10

SEMICONDUCTOR DEVICE

CROSS REFERENCE TO RELATED APPLICATIONS

This application is based upon and claims the benefit of priority of the prior Japanese Patent Application No. 2018-237070, filed on Dec. 19, 2018, the entire contents of which are incorporated herein by reference.

BACKGROUND OF THE INVENTION

1. Field of the Invention

Embodiments of the invention relate to a semiconductor device.

2. Description of the Related Art

Conventionally, in insulated gate bipolar transistors (IGBTs) and reverse conducting IGBTs (RC-IGBTs), when a trench-gate structure in which electrodes are embedded on an insulating film in trenches formed in a semiconductor substrate, all the electrodes in the trenches (hereinafter, gate trenches) in an active region are connected to a gate pad in a commonly known structure (hereinafter, gate ratio of 100%).

A further commonly known structure includes in an $n^-$-type drift region near a pn junction between a base region and a drift region, a charge (carrier) storage region for storing charge that is minority carriers during an ON state (for example, refer to Japanese Patent No. 5025071 (paragraphs 0161, 0166, FIGS. 24 to 28)). In a case of an n-channel type IGBT, a carrier storage region (hereinafter, storage region) is an n-type region that has a same conductivity type as the $n^-$-type drift region and a higher impurity concentration than that of the $n^-$-type drift region, and minority carriers are holes (electron holes).

By providing the storage region, injection enhanced ((IE): electron injection enhancement) effects are increased and conduction loss is reduced.

SUMMARY OF THE INVENTION

According to an embodiment, a semiconductor device includes a first semiconductor region of a first conductivity type, provided in a semiconductor substrate, a second semiconductor region of a second conductivity type, provided in the semiconductor substrate closer to a front surface of the semiconductor substrate than is the first semiconductor region, the second semiconductor region having a front side at the front surface of the semiconductor substrate and a rear side facing the first semiconductor region, a third semiconductor region of the first conductivity type, provided in the semiconductor substrate at the rear side of the second semiconductor region, the third semiconductor region having an impurity concentration higher than an impurity concentration of the first semiconductor region, a fourth semiconductor region of the first conductivity type, selectively provided in the second semiconductor region, a fifth semiconductor region of the second conductivity type, provided in the semiconductor substrate closer to a rear surface of the semiconductor substrate than is the first semiconductor region, the fifth semiconductor region being in contact with the first semiconductor region, a plurality of trenches penetrating the fourth semiconductor region and the second semiconductor region, and reaching the first semiconductor region, the plurality of trenches being disposed at predetermined intervals in a range of 0.7 μm to 2 μm, the plurality of trenches including a plurality of gate trenches and a plurality of dummy trenches, a plurality of first electrodes provided in the plurality of trenches via insulating films, the plurality of first electrodes including a plurality of dummy gate electrodes, each of which is provided in a corresponding one of the dummy trenches, and a plurality of gate electrodes each having a gate potential, each of the gate electrodes being provided in a corresponding one of the gate trenches, a total number of the gate electrodes being in a range of 60% to 84% of a total number of the first electrodes, a second electrode electrically connected to the second semiconductor region, the fourth semiconductor region and the dummy gate electrodes, and a third electrode electrically connected to the fifth semiconductor region.

In the embodiment, an impurity concentration of the third semiconductor region is in a range of $2\times10^{14}/cm^3$ to $5\times10^{16}/cm^3$.

In the embodiment, the total number of the gate electrodes is in a range of 75% to 84% of the total number of the first electrodes, the at least one third semiconductor region includes two third semiconductor regions, one of the two third semiconductor regions having an impurity concentration lower than an impurity concentration of the other of the two third semiconductor regions, the other one of the two third semiconductor regions is disposed between one of the gate trenches and one of the dummy trenches that are adjacent to each other, and two adjacent gate trenches among the plurality of gate trenches has the one of the two third semiconductor regions disposed therebetween.

In the embodiment, the total number of the gate electrodes is in a range of 75% to 84% of the total number of the first electrode, the plurality of gate trenches include two adjacent gate trenches that are disposed between two adjacent dummy trenches among the plurality of dummy trenches, and the third semiconductor region is absent from between the two adjacent gate trenches.

In the embodiment, a depth of a bottom of the third semiconductor region measured from the front surface of the semiconductor substrate in a direction perpendicular to the front surface of the semiconductor substrate is between respective depths of a bottom of the second semiconductor region and a bottom of the plurality of trenches.

In the embodiment, the semiconductor device includes in the semiconductor substrate, a first element region, and a first element disposed in the first element region; and a second element region, and a second element disposed in the second element region, the second element region being adjacent to the first element region. The first element includes: the first semiconductor region, the second semiconductor region, the third semiconductor region, the fourth semiconductor region, the fifth semiconductor region, the gate trenches, the dummy trenches, the gate electrodes, the dummy gate electrodes, the second electrode, and the third electrode. The second element includes the first semiconductor region, the second semiconductor region, the third semiconductor region, the dummy trenches, the dummy gate electrodes, the second electrode, and the third electrode, and a sixth semiconductor region of the first conductivity type, the sixth semiconductor region being provided in the semiconductor substrate closer to the rear surface of the semiconductor substrate than is the first semiconductor region, the sixth semiconductor region being in contact with the first semiconductor region and being electrically connected to the third electrode, the sixth semiconductor region having an impurity concentration higher than that of the first semiconductor region.

In the embodiment, the semiconductor device further includes a seventh semiconductor region of the first conductivity type, provided in the first semiconductor region between the first semiconductor region and the fifth semiconductor region, the seventh semiconductor region being in contact with the first semiconductor region and having an impurity concentration higher than the impurity concentration of the first semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 14 is a characteristics diagram depicting a relationship between conduction loss Eon during turn ON in a fifth example and dV/dt of voltage between the collector and the emitter during turn ON.

DETAILED DESCRIPTION OF THE INVENTION

Figure 1:
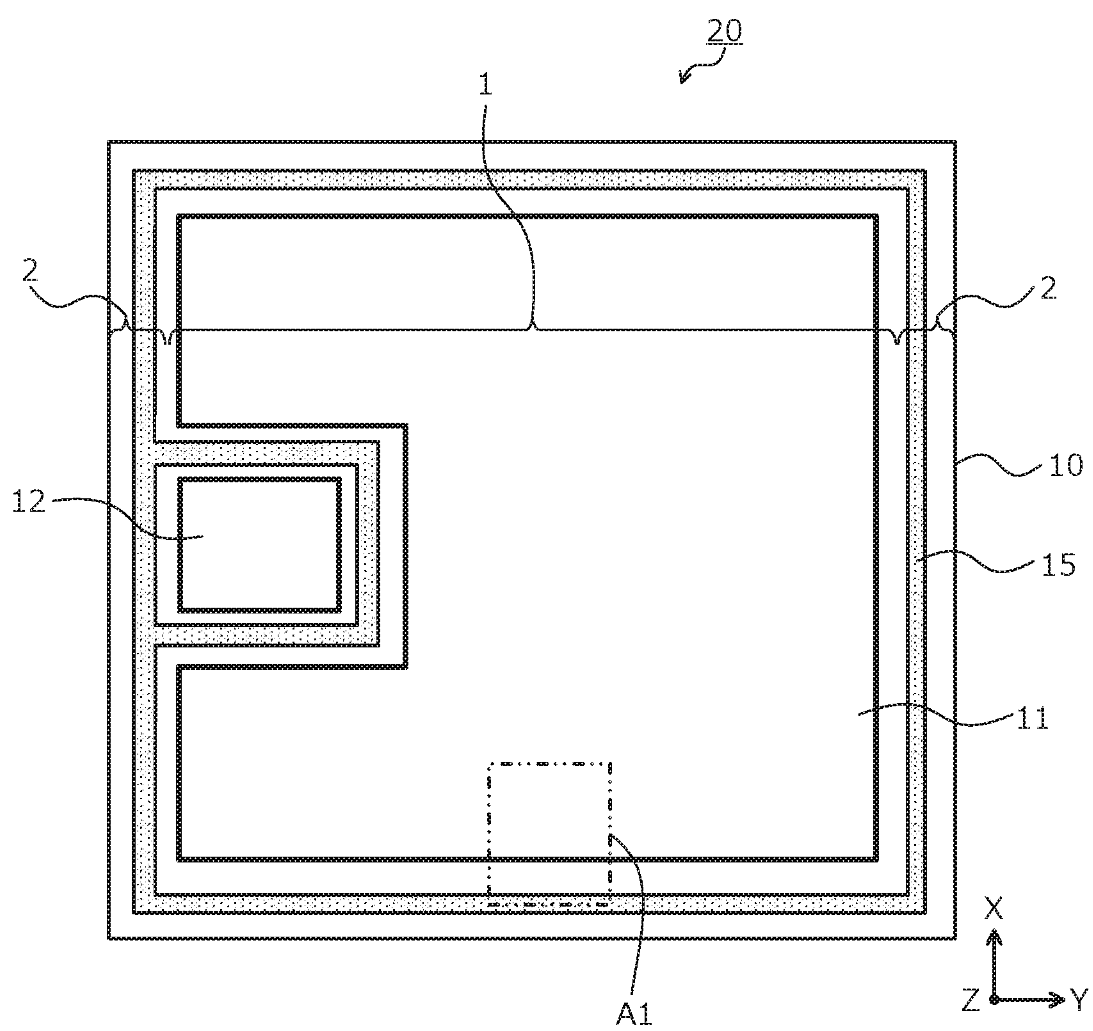
FIG. 1 is a plan view of a layout when a semiconductor device according to a first embodiment is viewed from a front surface side of a semiconductor substrate.

To solve problems associated with the conventional techniques, one object of the present invention is to provide a semiconductor device enabling improvement of di/dt controllability for current between a collector and an emitter during turn ON and suppression of oscillation.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

(Experiment) In a trench-gate structure, IE effects are also increased by reducing an interval of gate trenches and increasing channel density. For example, in an IGBT having a gate ratio of 100%, an interval (hereinafter, mesa width) at which trenches are disposed is about 2.8 μm or less. A dose amount of an ion implantation for forming a storage region is about $6\times10^{12}/cm^2$ and an impurity concentration of the storage region is about $5\times10^{16}/cm^3$.

When a storage region is provided in an IGBT having a gate ratio of 100%, during turn ON, minority carriers easily accumulate directly beneath (collector region side) the storage region and minority carriers in the semiconductor substrate are difficult to be drawn out to an emitter electrode. As a result, during turn ON, parasitic capacitance formed at a gate insulating film between a gate electrode and a semiconductor is easily charged by minority carriers.

When the parasitic capacitance is easily charged by minority carriers during turn ON, gate voltage (voltage between a gate and an emitter) is raised and controllability of di/dt (current variation rate per unit time) by gate resistance degrades for current between the collector and the emitter. Further, during turn ON, when a maximum current value of di/dt of the current between the collector and the emitter is high, a waveform of the current between the collector and the emitter easily oscillates and turn OFF easily occurs at an unintended timing due to errant operation of the device.

Figure 18:
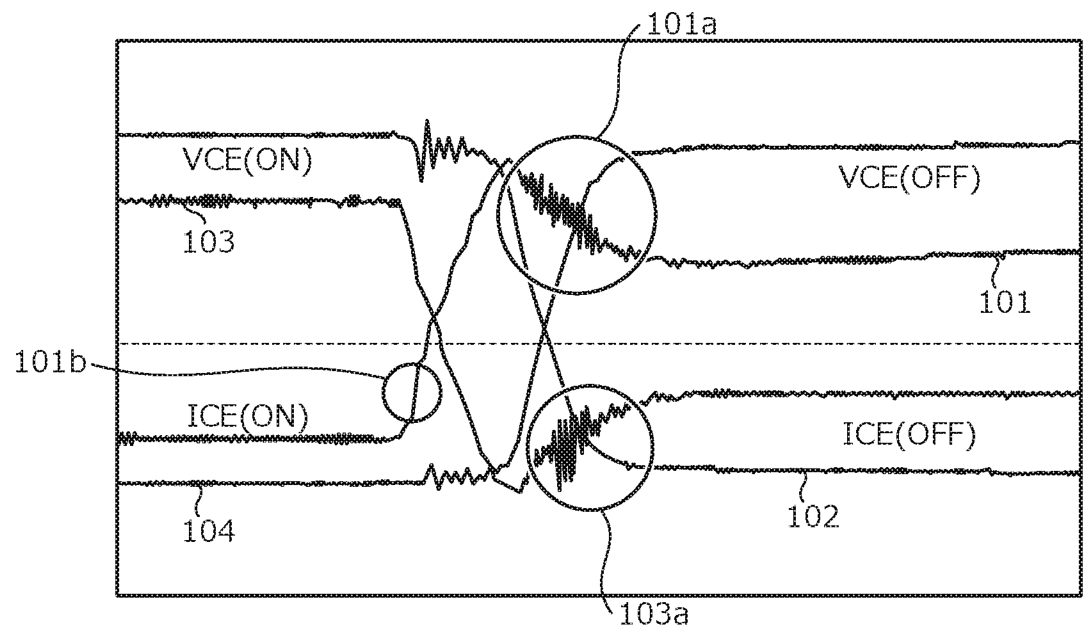
FIG. 18 is a characteristics diagram depicting voltage/current waveforms of a first conventional example.

Verification regarding these problems was performed. FIG. 18 is a characteristics diagram depicting voltage/current waveforms of a first conventional example. FIG. 18 depicts operation waveforms in a bridge circuit in which two RC-IGBTs (hereinafter, first conventional example) having a gate ratio of 100% and including a storage region having an impurity concentration of $5\times10^{16}/cm^3$ are connected in series. Reference numeral 102 is a voltage waveform of voltage VCE (ON) between the collector and the emitter during turn ON of a lower arm (low-potential side) RC- IGBT and reference numeral 101 depicts a current waveform of current ICE (ON) between the collector and the emitter during turn ON of the lower arm RC-IGBT. Reference numeral 104 is a voltage waveform of voltage VCE (OFF) between the collector and the emitter during turn OFF of an upper arm (high-potential side) RC-IGBT and reference numeral 103 depicts a current waveform of current ICE (OFF) between the collector and the emitter during turn OFF of the upper arm RC-IGBT.

From the results depicted in FIG. 18, it was confirmed that in the first conventional example, during turn ON of the lower arm RC-IGBT, after the current waveform 101 of the current ICE (ON) between the collector and the emitter during turn ON of the lower arm RC-IGBT rises, the current waveform 101 of the current ICE (ON) between the collector and the emitter during turn ON of the lower arm RC-IGBT oscillates (reference character 101*a*). Further, it was confirmed that during turn OFF of the upper arm RC-IGBT, the current waveform 103 of the current ICE (OFF) between the collector and the emitter during turn OFF of the upper arm RC-IGBT is pulled by the current between the collector and the emitter during turn ON of the lower arm RC-IGBT and oscillates (reference character 103*a*). Verification of a reason that the current waveform of the current ICE between the collector and the emitter in the first conventional example oscillates (reference characters 101*a*, 103*a*) in this manner was performed by simulation of hole density in a device of the first conventional example.

Figure 19:
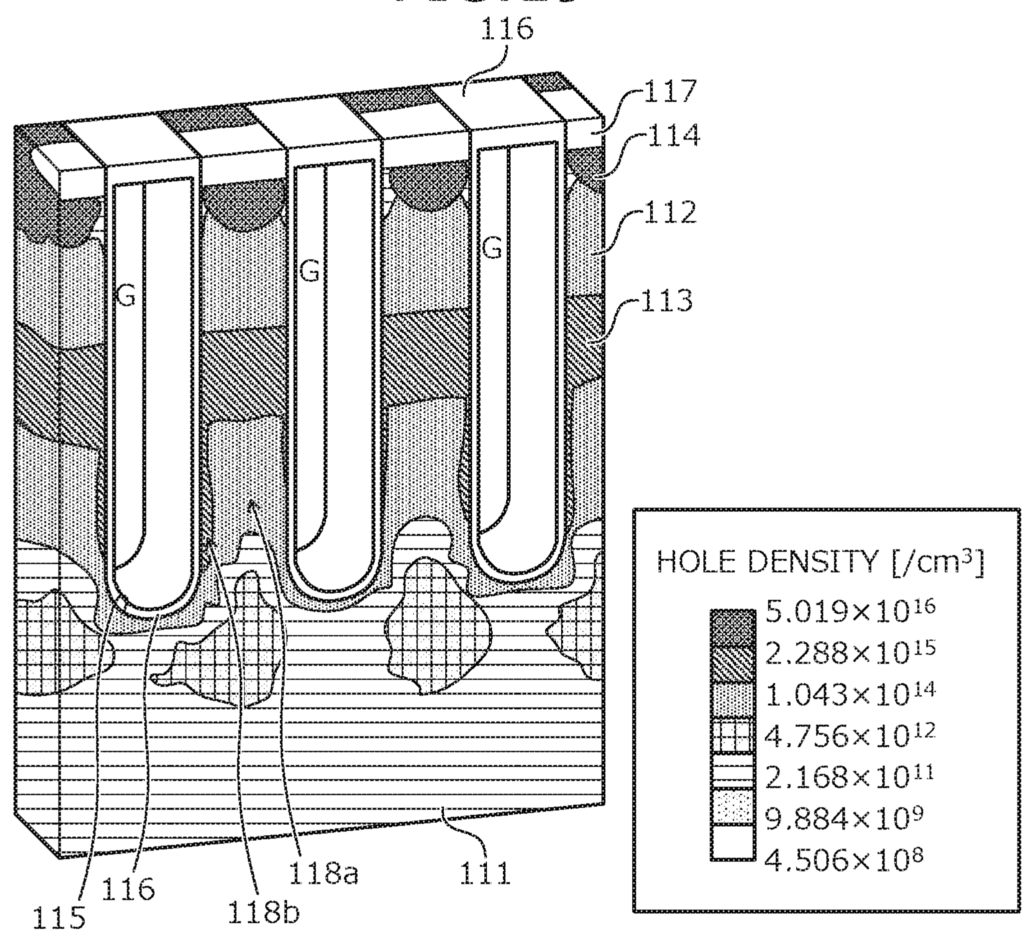
FIG. 19 is a perspective view of minority carrier density distribution in the first conventional example.

For the first conventional example, results of simulation of the hole density in the device at an initial rise 101*b* of the current waveform 101 of the current ICE (ON) between the collector and the emitter during turn ON are depicted in FIG. 19. FIG. 19 is a perspective view of minority carrier density distribution in the first conventional example. As depicted in FIG. 19, it was confirmed that holes easily accumulate at a portion 118*a* in an $n^-$-type drift region 111 and directly beneath a storage region 113, and holes overcharge a portion 118*b* of a gate insulating film 116 along a side wall of a gate trench 115. It is presumed that due to this overcharge, the bridge circuit satisfies a resonance condition, and the current waveforms 101, 103 of the current ICE between the collector and the emitter oscillate (reference characters 101*a*, 103*a*) (refer to FIG. 18). On the other hand, in an RC-IGBT having a gate ratio of 100% and not including the storage region 113, oscillation of the current waveform of the current ICE between the collector and the emitter was not confirmed. A reason for this is presumed to be that an amount of hole charging to the portion of the gate insulating film 116 along the side wall of the gate trench 115 is low. Reference numerals 112, 114, 117 are a $p^-$-type base region, a $p^+$-type contact region, and an $n^+$-type emitter region, respectively.

Figure 20:
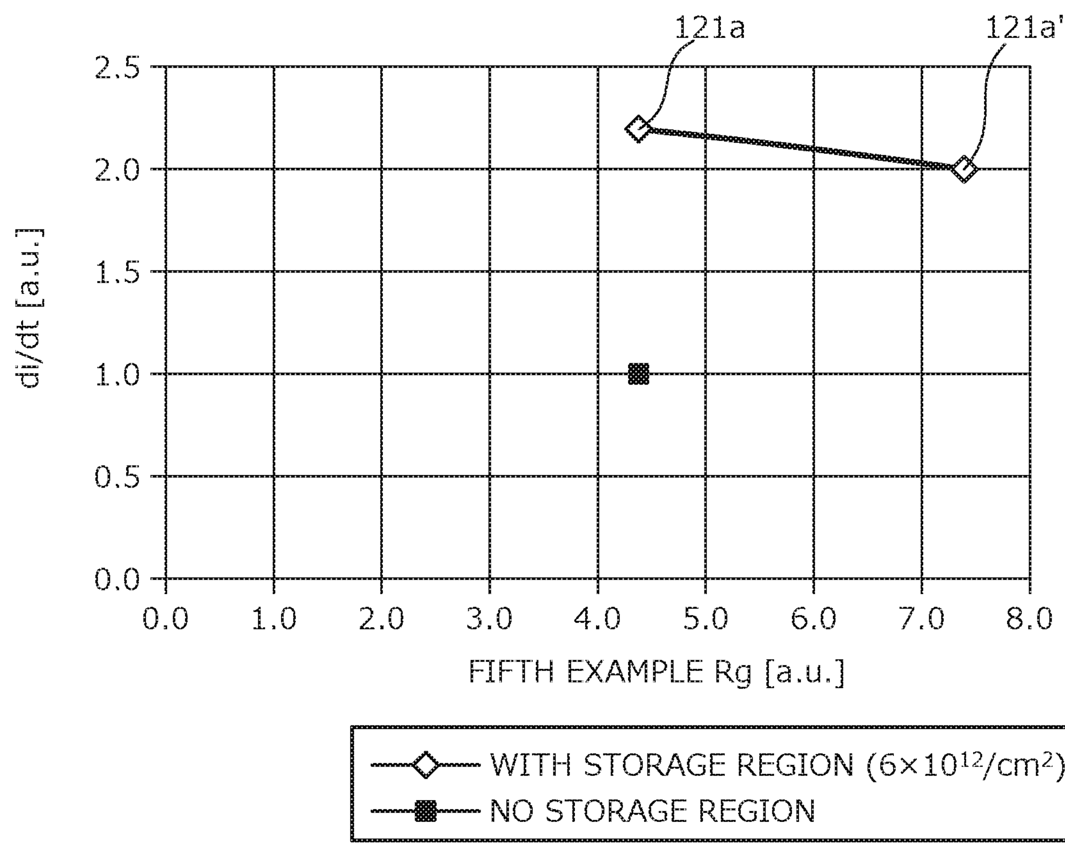
FIG. 20 is a characteristics diagram depicting controllability of di/dt by gate resistance, for current between a collector and an emitter during turn ON in a second conventional example.
Figure 21:
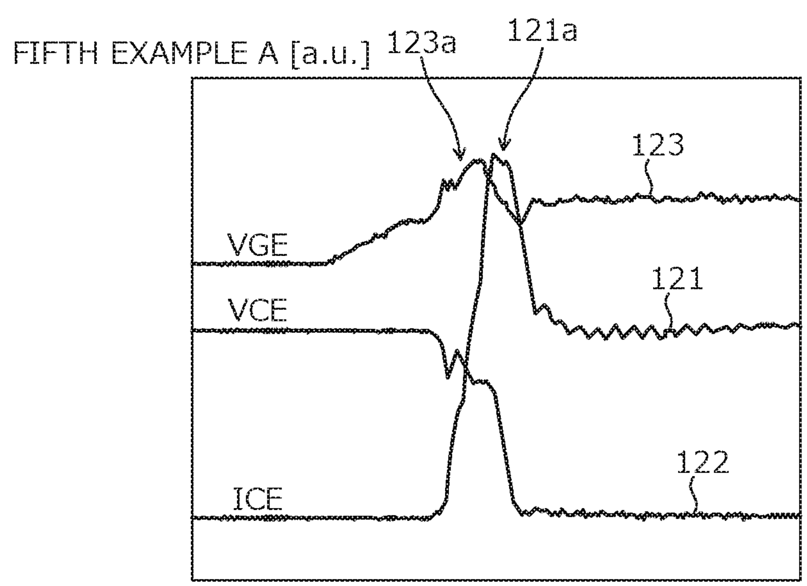
FIG. 21 is a characteristics diagram depicting voltage/current waveforms during turn ON in the second conventional example.
Figure 22:
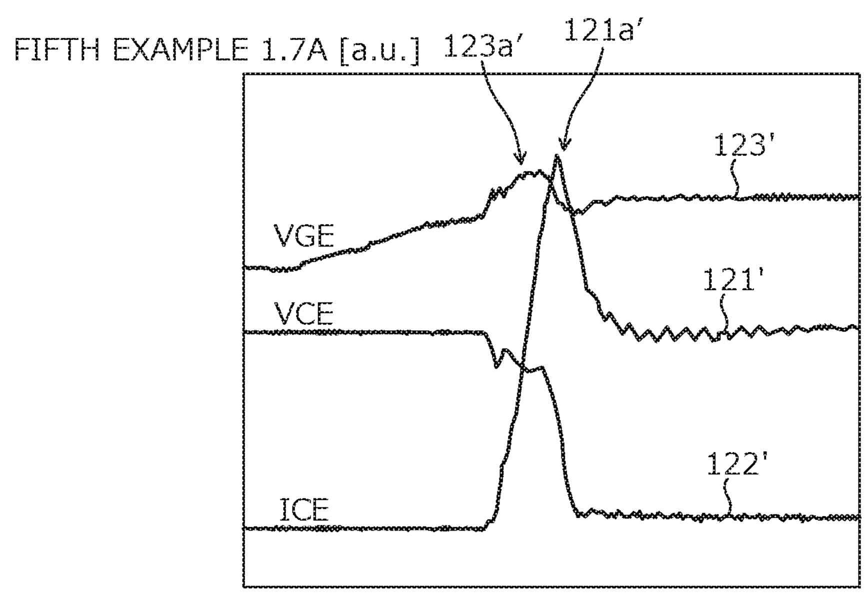
FIG. 22 is a characteristics diagram depicting voltage/current waveforms during turn ON in the second conventional example.

FIG. 20 is a characteristics diagram depicting controllability of di/dt by gate resistance, for current between the collector and the emitter during turn ON in a second conventional example. FIGS. 21 and 22 are characteristics diagrams depicting voltage/current waveforms during turn ON in the second conventional example. In FIG. 20, gate resistance along a horizontal axis and di/dt along a vertical axis are in an arbitrary unit (a.u.). In FIG. 20, for an IGBT (hereinafter, second conventional example (indicated as "with storage region" in FIG. 20)) having a gate ratio of 100% and including the storage region, maximum current values of di/dt during turn ON, for current between the collector and the emitter in samples for cases in which two different gate resistances are prepared are depicted. Resistance values of the two different gate resistances are assumed to be A (arbitrary unit), 1.7 A (arbitrary unit), respectively. The maximum current values of di/dt of the current between the collector and the emitter during turn ON in the second conventional example depicted in FIG. 20 are current values of peaks 121*a*, 121*a*' of rising edges of current waveforms 121, 121' of the current ICE between the collector and the emitter during turn ON and depicted in FIGS. 21 and 22.

Further, FIG. 20 depicts the maximum current value of di/dt of the current between the collector and the emitter during turn ON in an IGBT (hereinafter, first comparison example: in FIG. 20, indicated as "no storage region") having a gate ratio of 100% and not including a storage region. In FIGS. 21 and 22, for the second conventional example in which the resistance values of the gate resistance were set as A (arbitrary unit) and 1.7 A (arbitrary unit), during turn ON, voltage waveforms 123, 123' of voltage VGE between a gate and the emitter (portions indicated by reference characters 123*a*, 123*a*') rise, and current values of the peaks 121*a*, 121*a*' of the rising edges of the current waveforms 121, 121' of the current ICE between the collector and the emitter are high. Reference numerals 122 and 122' are voltage waveforms of the voltage VCE between the collector and the emitter during turn ON.

From the results depicted in FIG. 20, it was confirmed that in the second conventional example, as compared to the first comparison example, the maximum current values of di/dt of the current between the collector and the emitter during turn ON are about two times higher and controllability of di/dt by gate resistance degrades for the current between the collector and the emitter during turn ON. Further, in the second conventional example, it was confirmed that in the sample in which the gate resistance value was 1.7 A (arbitrary unit), as compared to the sample in which the gate resistance value was A (arbitrary unit), the maximum current value of di/dt of the current between the collector and the emitter during turn ON was reduced only about 3%. In this manner, in the IGBT having a gate ratio of 100% and including the storage region, it is presumed that even when the resistance value of the gate resistance is increased, di/dt controllability of the current between the collector and the emitter during turn ON degrades and therefore, is easily affected by noise.

The present invention is based on consideration and knowledge from this experiment.

Figure 2:
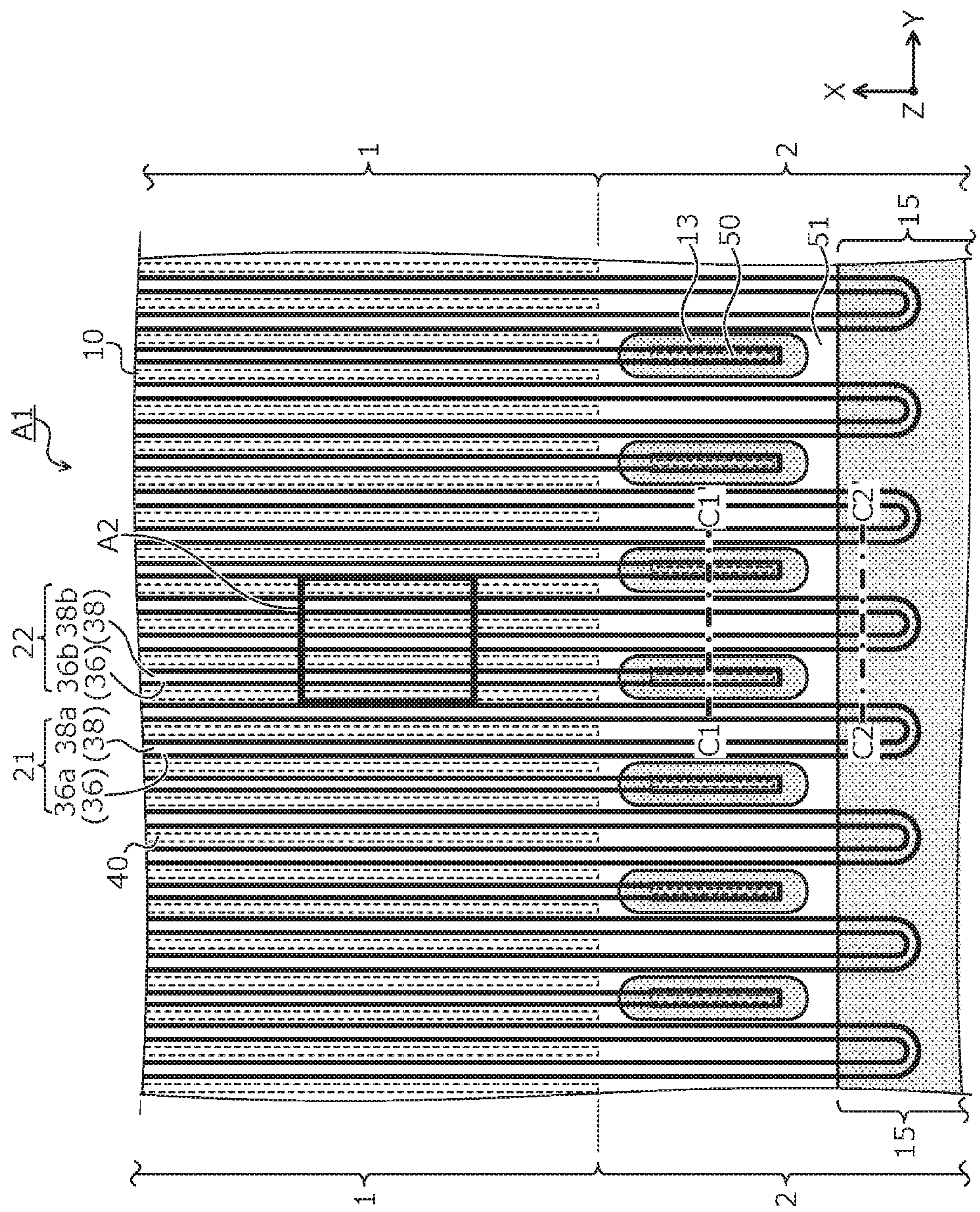
FIG. 2 is an enlarged plan view of a portion surrounded by a rectangular frame A1 in FIG. 1.
Figure 3:
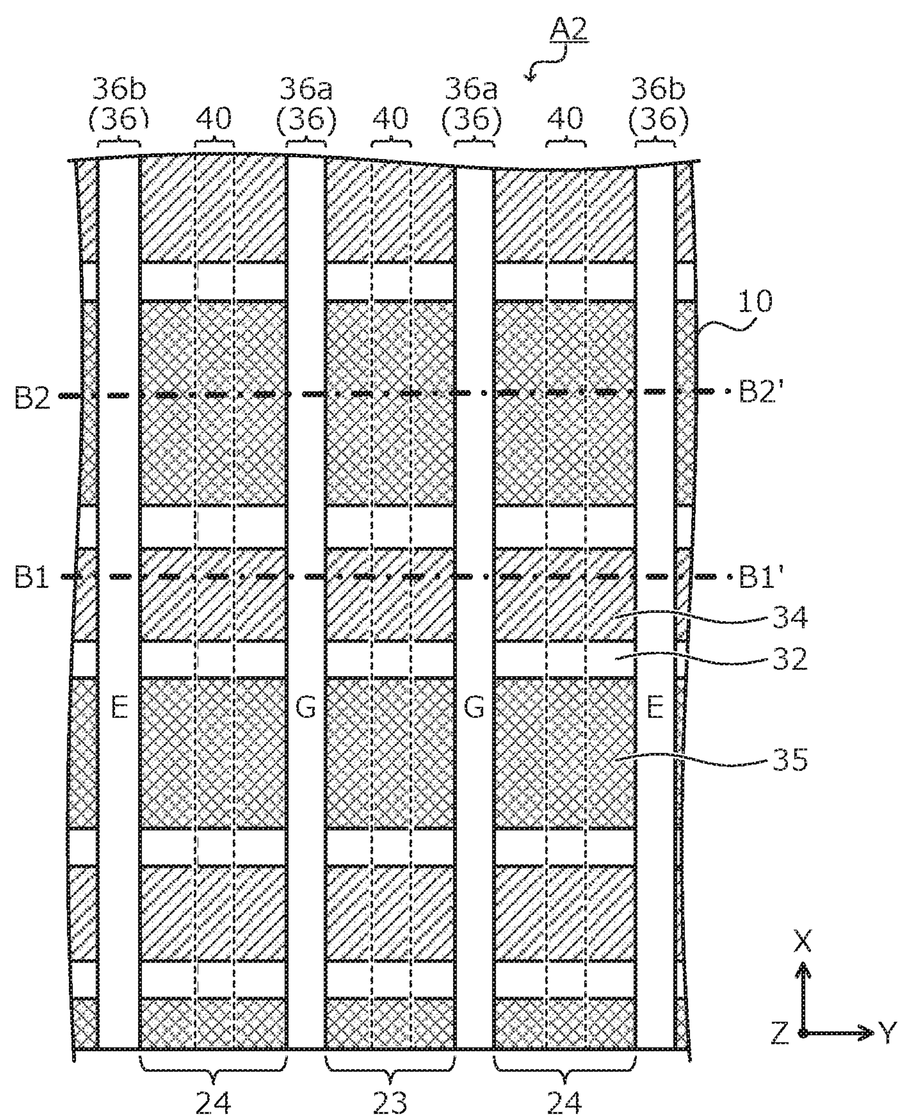
FIG. 3 is an enlarged plan view of a portion surrounded by a rectangular frame A2 in FIG. 2.
Figure 4:
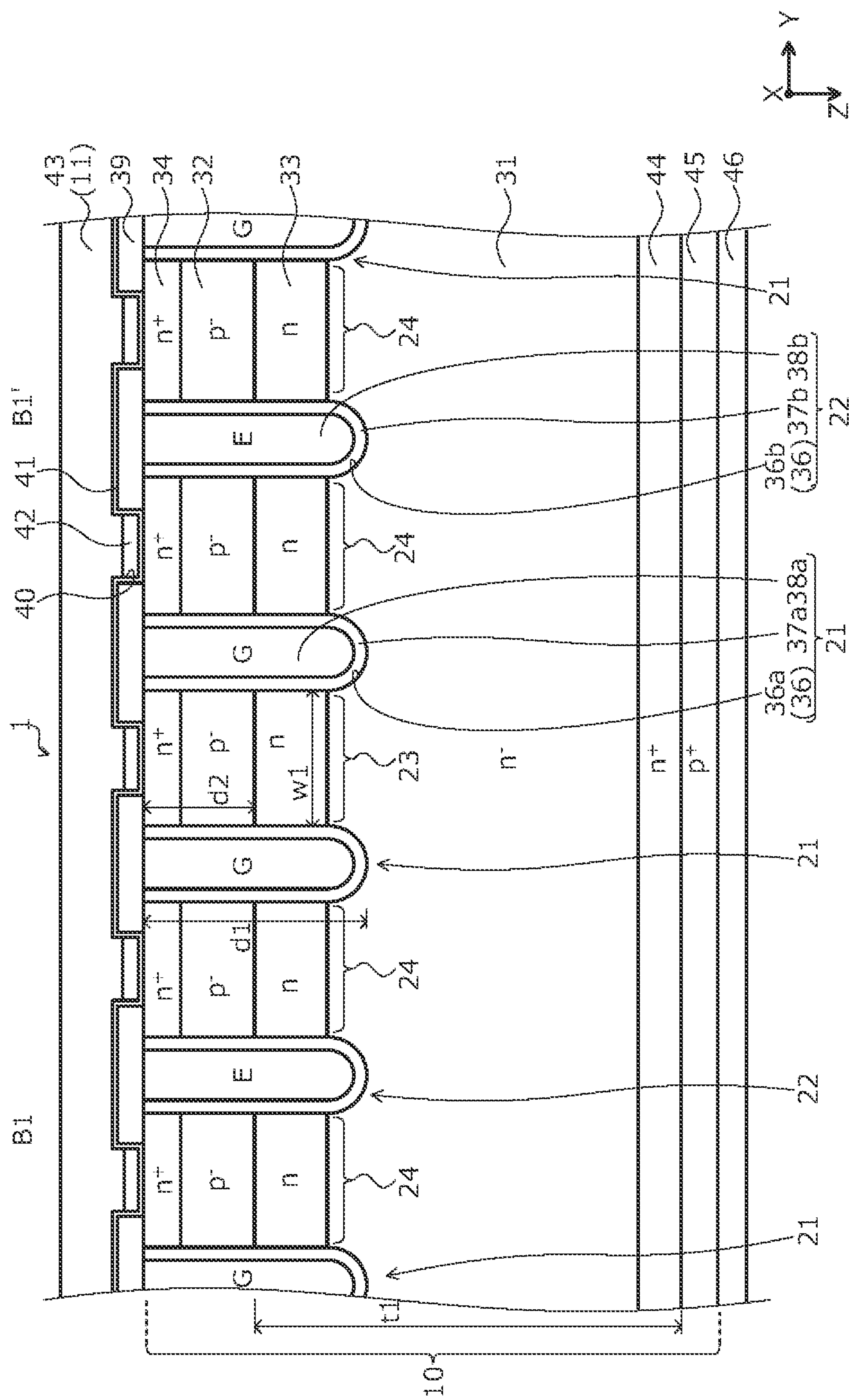
FIG. 4 is a cross-sectional view of a structure along cutting line B1-B1' in FIG. 3.
Figure 5:
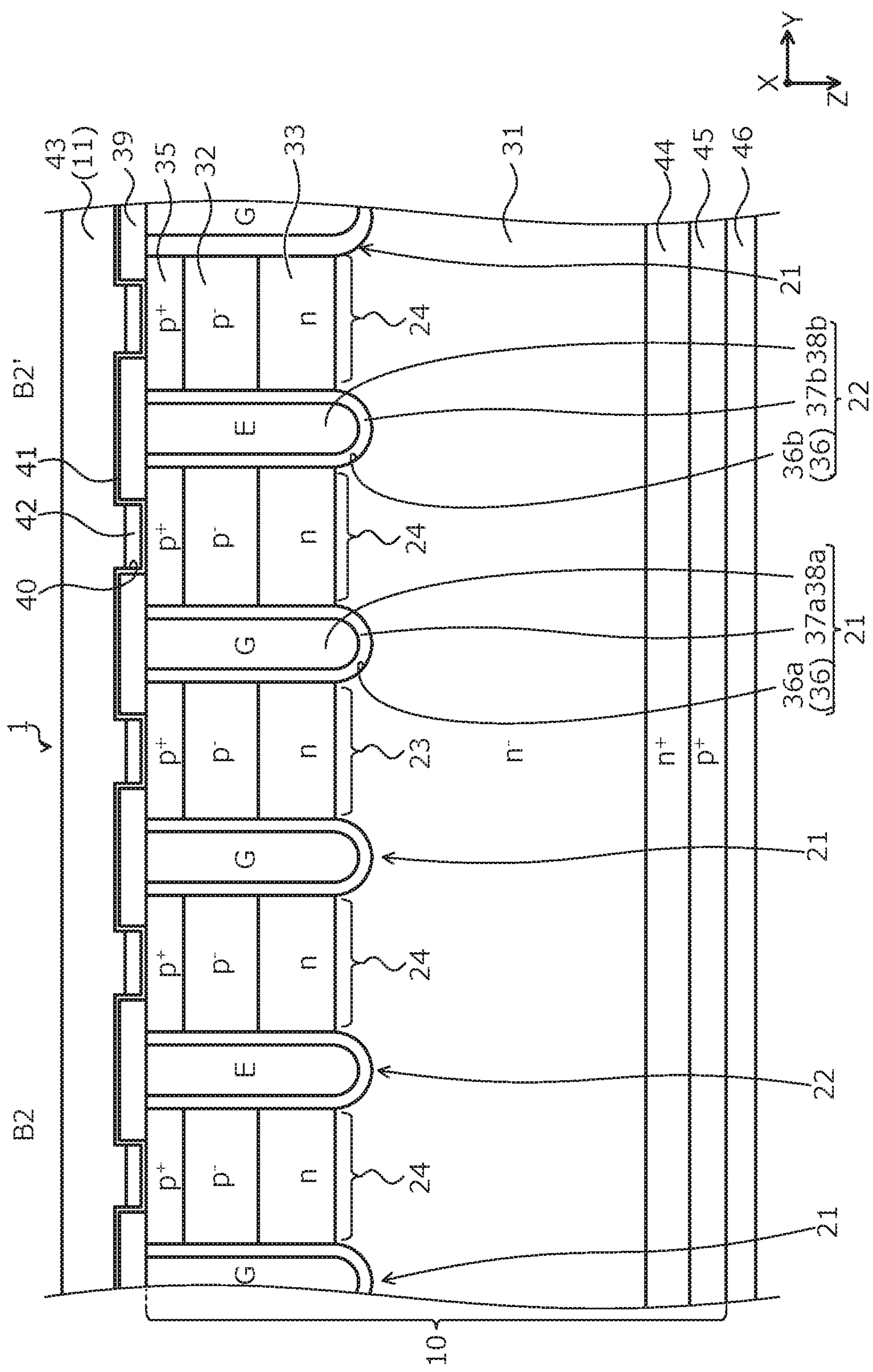
FIG. 5 is a cross-sectional view of a structure along cutting line B2-B2' in FIG. 3.
Figure 6:
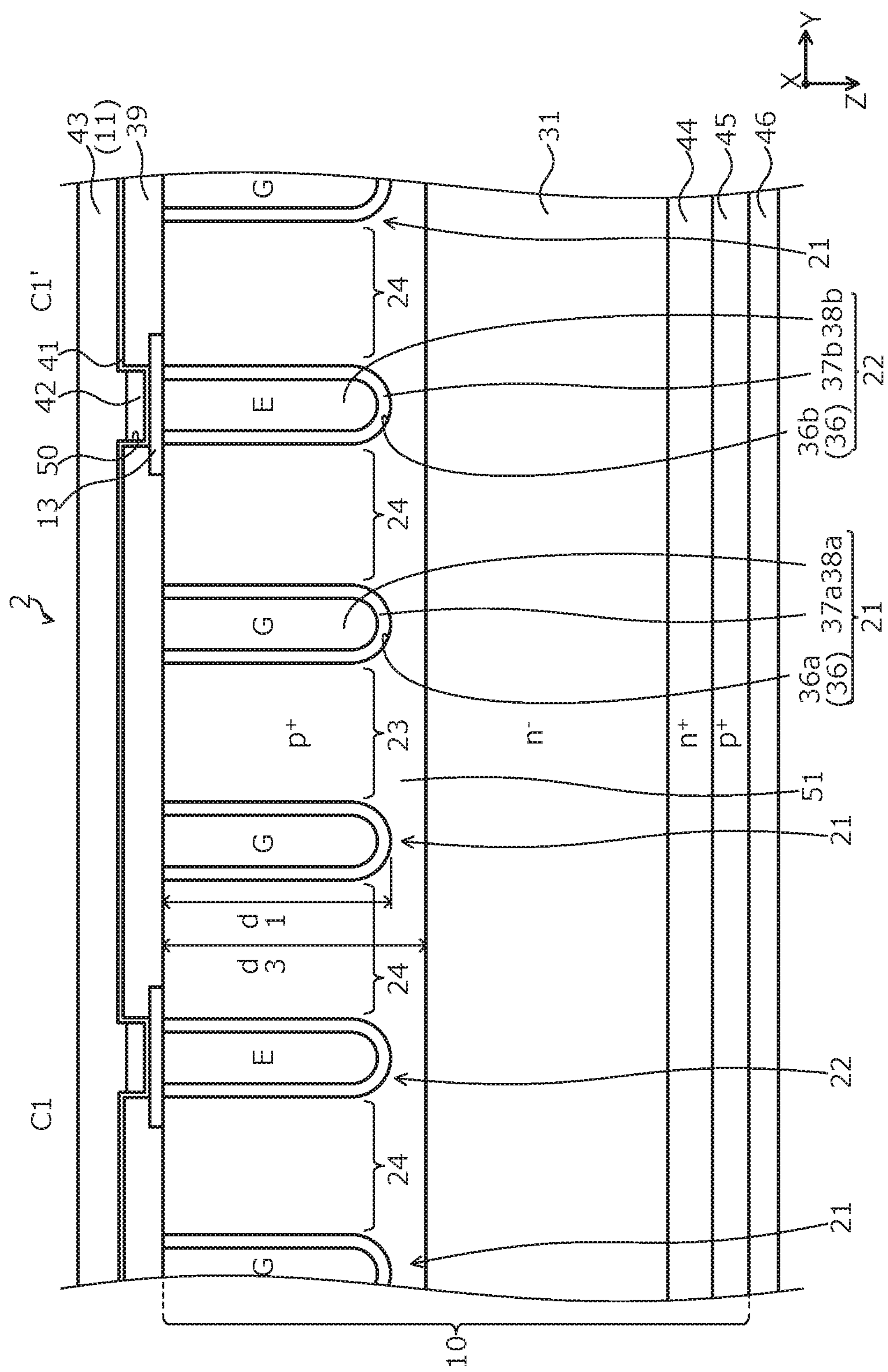
FIG. 6 is a cross-sectional view of a structure along cutting line C1-C1' in FIG. 2.
Figure 7:
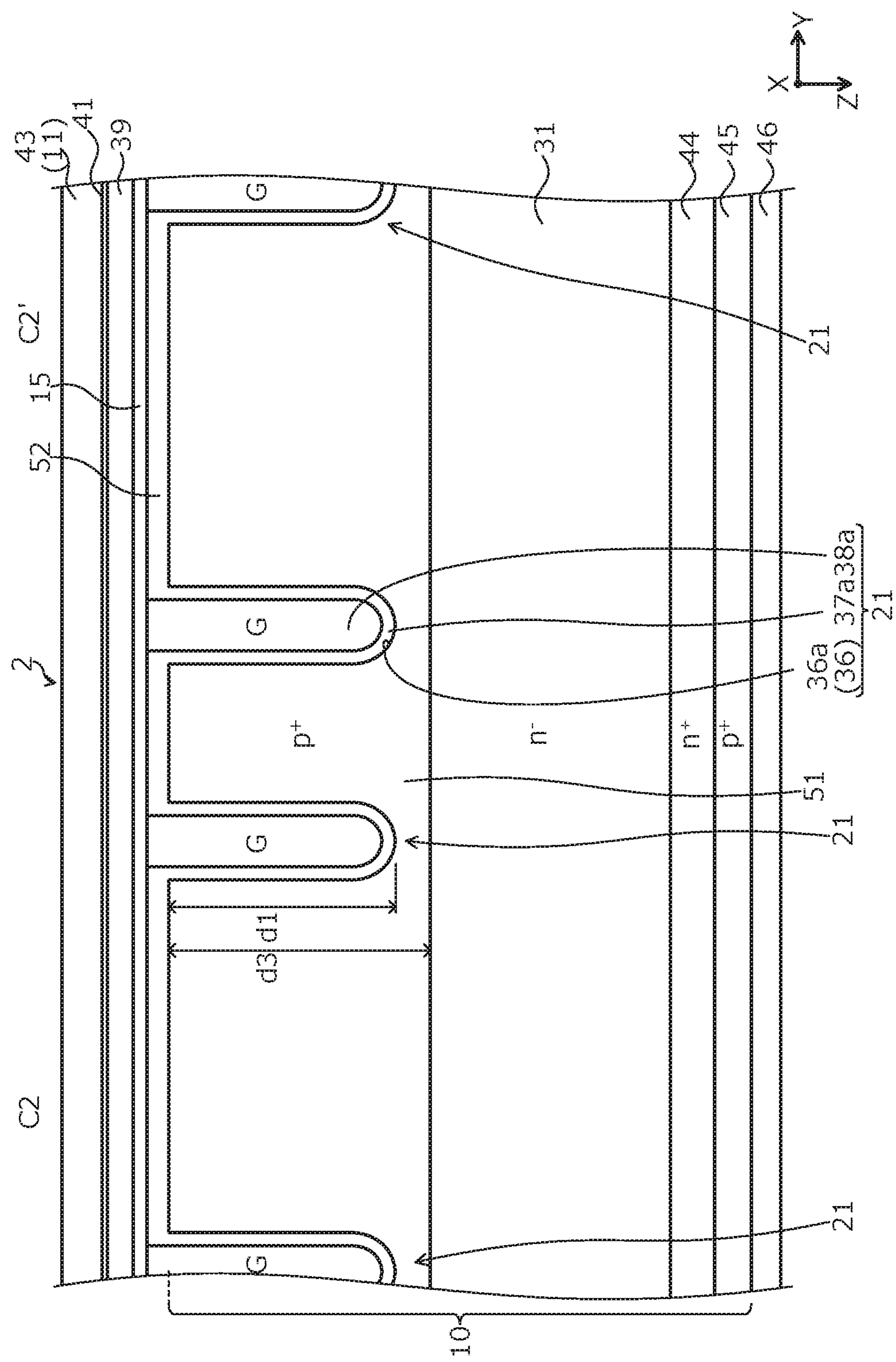
FIG. 7 is a cross-sectional view of a structure along cutting line C2-C2' in FIG. 2.

A structure of a semiconductor device according to a first embodiment will be described. FIG. 1 is a plan view of a layout when the semiconductor device according to the first embodiment is viewed from a front surface side of a semiconductor substrate. FIG. 2 is an enlarged plan view of a portion surrounded by a rectangular frame A1 in FIG. 1. FIG. 3 is an enlarged plan view of a portion surrounded by a rectangular frame A2 in FIG. 2. FIGS. 4 and 5 are cross-sectional views of a structure along cutting line B1-B1' and cutting line B2-B2' in FIG. 3, respectively. FIGS. 6 and 7 are cross-sectional views of a structure along cutting line C1-C1' and cutting line C2-C2' in FIG. 2, respectively.

The semiconductor device according to the first embodiment and depicted in FIGS. 1 to 7 is an n-channel type IGBT alone including in an active region 1 of a semiconductor substrate (semiconductor chip) 10, a trench-gate structure having at a predetermined ratio described hereinafter, MOS gates (hereinafter, trench gates) 21 of a gate potential and MOS gates (hereinafter, dummy gates) 22 of an emitter potential, and a storage region (third semiconductor region) 33. The active region 1 is a region in which current flows when an element is in an ON state. As depicted in FIG. 1, the active region 1 has, for example, a substantially rectangular planar layout.

An edge termination region 2 surrounds a periphery of the active region 1. The edge termination region 2 is a region between the active region 1 and an end (chip end) of the semiconductor substrate 10 and is a region that mitigates electric field at the front surface side of the semiconductor substrate 10 and sustains breakdown voltage (withstand voltage). Breakdown voltage is a voltage limit at which no errant operation or destruction of an element occurs. In the edge termination region 2, an edge termination structure is disposed such as a field limiting ring (FLR), a mesa structure, a junction termination extension (JTE) structure, and a field plate.

In the active region 1, at a front surface of the semiconductor substrate 10, electrode pads such as an emitter pad 11 and a gate pad 12 are disposed separated from each other. The emitter pad 11, in the active region 1, covers substantially an entire surface region excluding a region in which the gate pad 12 is disposed. The emitter pad 11 functions as an emitter electrode 43 (refer to FIGS. 4 to 7). The emitter pad 11 is electrically connected to the dummy gates 22 via emitter poly-silicon (poly-Si) layers 13 (refer to FIG. 2).

The gate pad 12 is electrically connected to the trench gates 21 (refer to FIG. 2) via a gate runner 15. The gate runner 15 is provided in the edge termination region 2 and surrounds a periphery of the active region 1 in a substantially rectangular shape. The gate runner 15 is a poly-silicon layer provided via a field oxide film 52 (refer to FIG. 7) on the front surface of the semiconductor substrate 10. In FIGS. 1 and 2, poly-silicon layers of the emitter poly-silicon layers 13 and the gate runner 15, etc. are indicated by hatching.

As depicted in FIG. 2, trenches 36 configuring the trench-gate structure are provided in a striped shape extending in a direction (hereinafter, first direction) X parallel to the front surface of the semiconductor substrate 10. A proportion of a number (count) of trenches (gate trenches) 36*a* configuring the trench gates 21 is in a range from 60% to 84% of a total number (total count) of the trenches 36. Of all the trenches 36, the dummy gates 22 are embedded in trenches (hereinafter, dummy trenches) 36*b* other than the gate trenches 36*a*.

The proportion of the number of the gate trenches 36*a* is set to the upper limit or less, whereby similarly to the first comparison example in which the storage region 33 is not provided, during turn ON, the waveform of the current between the collector and the emitter does not oscillate and the controllability of di/dt by gate resistance is enhanced for the current between the collector and the emitter. The proportion of the number of the gate trenches 36*a* is set to be the lower limit or more, whereby a tradeoff relationship between conduction loss Eon during turn ON and dV/dt (voltage variation rate per unit time) of voltage between the collector and the emitter during turn ON may be improved.

In particular, the gate trenches 36*a* and the dummy trenches 36*b* are disposed in sets of a predetermined number alternating each other in a direction (hereinafter, second direction) Y that is parallel to the front surface of the semiconductor substrate 10 and orthogonal to the first direction X, so as to satisfy the proportion of the number of the gate trenches 36*a*. That is, as shown in FIG. 2, the gate trenches 36*a* face the dummy trenches 36*b* in the second direction Y, but do not face the dummy trenches 36*b* in the first direction X. FIGS. 2 to 7 depict a case in which for every two of the gate trenches 36*a* disposed in the second direction Y, one of the dummy trenches 36*b* is disposed. In other words, the proportion of the number of the gate trenches 36*a* relative to the total number of the trenches 36 is about 67%. In FIG. 2, the trench gates 21 and the dummy gates 22 are indicated by bold lines.

More specifically, while not depicted, for example, in the second direction Y, when two of the dummy trenches 36*b* are disposed for every three of the gate trenches 36*a* disposed, the proportion of the number of the gate trenches 36*a* relative to the total number of the trenches 36 is 60% (=3/(3+2)×100%). For example, in the second direction Y, when one of the dummy trenches 36*b* is disposed for every three of the gate trenches 36*a* disposed, the proportion of the number of the gate trenches 36*a* relative to the total number of the trenches 36 is 75% (=3/(3+1)×100%).

For example, in the second direction Y, when one of the dummy trenches 36*b* is disposed for every four of the gate trenches 36*a* disposed, the proportion of the number of the gate trenches 36*a* relative to the total number of the trenches 36 is 80% (=4/(4+1)×100%). For example, in the second direction Y, when one of the dummy trenches 36*b* is disposed for every five of the gate trenches 36*a* disposed, the proportion of the number of the gate trenches 36*a* relative to the total number of the trenches 36 is substantially 83% (≈5/(5+1)×100%).

The proportion of the number of the gate trenches 36*a* relative to the total number of the trenches 36 is determined with consideration of the following characteristics.

A first characteristic is a tradeoff between ON voltage and short circuit capability. As the proportion of the number of the gate trenches 36*a* relative to the total number of the trenches 36 increases, a carrier injection amount from an $n^+$-type emitter region 34 to an $n^-$-type drift region 31 increases and while the ON voltage improves, the short circuit capability decreases. A second characteristic is that as the proportion of the number of the gate trenches 36*a* relative to the total number of the trenches 36 increases, input capacitance (sum of capacitance between the gate and the emitter and capacitance between the gate and the collector) and feedback capacitance (capacitance between the gate and the collector) increases, and switching loss increases due to increases of a Miller period charging these parasitic capacitances.

Of these IGBT parasitic capacitances, the capacitance between the gate and the collector may be reduced as a thickness t1 of an n-type region formed by sequentially stacking an $n^+$-type buffer region (seventh semiconductor region) 44, the $n^-$-type drift region 31, and the storage region 33 increases. A reason for this is that as the thickness t1 of the n-type region increases, a first gate electrode 38*a* of a gate potential described hereinafter and a $p^+$-type collector region 45 are further separated from each other in a thickness direction Z. When the capacitance between the gate and the collector decreases, degradation of di/dt controllability by gate resistance may be suppressed for the current between the collector and the emitter during turn ON, even when the proportion of the number of the gate trenches 36*a* relative to the total number of the trenches 36 is increased.

In particular, while variation occurs depending in whether the resistance value of the gate resistance is adjustable, for example, in a case of breakdown voltage of 600V, the thickness t1 of the n-type region formed by sequentially stacking the $n^+$-type buffer region 44, the $n^-$-type drift region 31, and the storage region 33 is thin and therefore, the proportion of the gate trenches 36*a* relative to the total number of the trenches 36, for example, is 67%. In a case of a breakdown voltage of 1200V, the thickness t1 of the n-type region formed by sequentially stacking the $n^+$-type buffer region 44, the $n^-$-type drift region 31, and the storage region 33 is from about 1.5 times to 2 times that in the case of the breakdown voltage of 600V and therefore, the proportion of the number of the gate trenches 36*a* relative to the total number of the trenches 36 may be, for example, up to 80%.

When the breakdown voltage is low, the thickness t1 of the n-type region formed by sequentially stacking the $n^+$-type buffer region 44, the $n^-$-type drift region 31, and the storage region 33 is thinner, whereby feedback capacitance increases. Therefore, to enhance di/dt controllability by gate resistance for the current between the collector and the emitter during turn ON, the proportion of the number of the gate trenches 36*a* relative to the total number of the trenches 36 may be reduced and the capacitance between the gate and the emitter may be reduced. The thickness t1 of the n-type region is a distance from an interface between a $p^-$-type base region 32 and the storage region 33, to an interface between the $n^+$-type buffer region 44 and the $p^+$-type collector region 45.

All of the trenches 36 extend from the active region 1 to the edge termination region 2 and terminate in the edge termination region 2. Ends of the gate trenches 36*a* face the gate runner 15 in the thickness direction Z. At the ends of the gate trenches 36*a*, first gate electrodes (gate electrode of first electrodes) 38*a* (refer to FIGS. 4 to 7) configuring the trench gates 21 and the gate runner 15 are in contact with each other. The gate trenches 36*a* may have a ring-shaped planar shape in which respective ends of the gate trenches 36*a* adjacent in the second direction Y are connected to each other.

Ends of the dummy trenches 36*b* terminate closer to the active region 1 than is the gate runner 15. The ends of the dummy trenches 36*b* respectively face in the thickness direction Z, the emitter poly-silicon layers 13. At the ends of the dummy trenches 36*b*, second gate electrodes (dummy gate electrodes of the first electrodes) 38*b* (refer to FIGS. 4 to 7) configuring the dummy gates 22 and the emitter pad 11 are electrically connected via the emitter poly-silicon layers 13. The emitter poly-silicon layers 13, for example, are interspersed along a border between the active region 1 and the edge termination region 2, closer to the active region 1 than is the gate runner 15.

As depicted in FIG. 3, between (mesa region 23) the gate trenches 36*a* that are adjacent to each other, and between (mesa region 24) the gate trench 36*a* and the dummy trench 36*b* that are adjacent to each other, the $n^+$-type emitter region (fourth semiconductor region) 34 and a $p^+$-type contact region 35 are provided in a same configuration in each of the mesa regions 23, 24. The $n^+$-type emitter region 34 and the $p^+$-type contact region 35 are disposed to repeatedly alternate each other in the first direction X. In FIG. 3, the $n^+$-type emitter region 34 and the $p^+$-type contact region 35 are respectively indicated by different hatching.

The $n^+$-type emitter region 34 and the $p^+$-type contact region 35 are disposed separated from each other along the first direction X, and between the $n^+$-type emitter region 34 and the $p^+$-type contact region 35, the $p^-$-type base region (second semiconductor region) 32 is exposed at the front surface of the semiconductor substrate 10. Without exposing the $p^-$-type base region 32 at the front surface of the semiconductor substrate 10, the $p^+$-type contact region 35 may be exposed at the front surface of the semiconductor substrate 10 overall between the $n^+$-type emitter regions 34 that are adjacent to each other along the first direction X. In this case, a contact surface area between the $p^+$-type contact region 35 and the emitter electrode 43 increases and therefore, a function of pulling holes in the $n^-$-type drift region 31 during turn OFF to the emitter electrode 43 may be enhanced.

The $n^+$-type emitter region 34 and the $p^+$-type contact region 35 extend to the side walls of the trenches 36 adjacent thereto along the second direction Y. The $n^+$-type emitter region 34 needs not be provided in the mesa region 24 between the dummy trenches 36*b* that are adjacent to each other. In contact holes 40, contacts (electrical contacts) between the emitter pad 11 and, the $n^+$-type emitter region 34 and the $p^+$-type contact region 35 are formed. The contact holes 40 extend linearly along the first direction X. In FIG. 2, the contact holes 40 are portions surrounded by a U-shaped dashed line.

A cross-section of a structure of a semiconductor device 20 according to the first embodiment will be described. As depicted in FIGS. 4 and 5, in the semiconductor substrate 10, spanning the active region 1 and the edge termination region 2, the $n^-$-type drift region (first semiconductor region) 31 is provided. In a surface layer at the front surface of the semiconductor substrate 10, the $p^-$-type base region 32 is provided spanning the active region 1 overall. The $p^-$-type base region 32 is provided in the semiconductor substrate 10 of an $n^-$-type, closer to the front surface of the semiconductor substrate 10 than is the $n^-$-type drift region 31. Between the $n^-$-type drift region 31 and the $p^-$-type base region 32, the storage region 33 is provided spanning the active region 1 overall.

The storage region 33 is an n-type region that has a same conductivity type as the $n^-$-type drift region 31 and an impurity concentration higher than that of the $n^-$-type drift region 31. In the storage region 33, minority carriers accumulate during turn ON. In a case of an n-channel type IGBT, the minority carriers are holes (electron holes). Minority carriers accumulate in the storage region 33 during turn ON and therefore, IE (electron injection enhancement) effects increase and conduction loss decreases. Further, the dummy gates 22 are provided, whereby IE effects by the storage region 33 are suppressed from becoming too high.

The storage region 33 is in contact with the $n^-$-type drift region 31 and the $p^-$-type base region 32. Further, the storage region 33 reaches a deep position toward the collector (toward the $p^+$-type collector region 45), from an interface between the $p^-$-type base region 32 and the $n^-$-type drift region 31. In particular, the storage region 33 is between a depth d2 of the $p^-$-type base region 32 and a depth d1 of a bottom of the trench 36. Further, the storage region 33 may be provided from the depth d2 of the $p^-$-type base region 32 to the depth d1 of the bottom of the trench 36. By disposing the storage region 33 from the depth d2 of the $p^-$-type base region 32 to the depth d1 of the bottom of the trench 36, a mathematical area of parasitic capacitance formed by a first gate insulating film 37*a* between the first gate electrode 38*a* and a semiconductor during turn ON decreases and therefore, the amount of hole charging to the parasitic capacitance may be decreased.

The impurity concentration of the storage region 33 is in a range, for example, from about $2\times10^{14}/cm^3$ to $5\times10^{16}/cm^3$. When the impurity concentration of the storage region 33 is higher than the upper limit, oscillation of the waveform of the current between the collector and the emitter during turn ON is impossible to suppress and thus, is undesirable. The higher the impurity concentration of the storage region 33 is, the more easily minority carriers accumulate during turn ON, thereby enabling ON resistance to be reduced. When the impurity concentration of the storage region 33 is lower than the lower limit, IE effects decrease, predetermined characteristics are not obtained and thus, is undesirable.

In the $p^-$-type base region 32, the $n^+$-type emitter region 34 and the $p^+$-type contact region 35 are selectively provided in the surface layer at the front surface of the semiconductor substrate 10. The trenches 36 penetrate the $n^+$-type emitter region 34, the $p^+$-type contact region 35, and the $p^-$-type base region 32 from the front surface of the semiconductor substrate 10 in the thickness direction Z, and reach the $n^-$-type drift region 31. In the mesa regions 23, 24, the storage region 33 is provided between the $p^-$-type base region 32 and the $n^-$-type drift region 31. The $n^+$-type emitter region 34, the $p^+$-type contact region 35, the $p^-$-type base region 32, and the storage region 33 extend to both of the trenches 36 that are adjacent to each other in the second direction Y, sandwiching either of the mesa regions 23, 24.

In each of the gate trenches 36*a* among the trenches 36, the first gate electrode 38*a* of the gate potential is provided via the first gate insulating film 37*a* and each of the trench gates 21 is configured by the gate trench 36*a*, the first gate insulating film 37*a*, and the first gate electrode 38*a*. In each of the dummy trenches 36*b* among the trenches 36, the second gate electrode 38*b* of the emitter potential is provided via a second gate insulating film 37*b* and each of the dummy gates 22 is configured by the dummy trench 36*b*, the second gate insulating film 37*b*, and the second gate electrode 38*b*.

An interval (mesa width) w1 at which the trenches 36 are disposed is narrow and reduced to, for example, about 0.7 μm to 2 μm. As a result, hole (electron hole) concentration increases, whereby IE effects increase and ON resistance may be reduced. As the mesa width w1 decreases, hole density increases and therefore, the current waveform of the current between the collector and the emitter easily oscillates. Thus, the number of the gate trenches 36*a* with respect to the total number of the trenches 36 is set to the proportion described above, whereby oscillation of the current waveform of the current between the collector and the emitter is suppressed.

An interlayer insulating film 39 is provided on the front surface of the semiconductor substrate 10 and covers the first and the second gate electrodes 38*a*, 38*b*. In the interlayer insulating film 39, the contact holes 40 are provided in each of the mesa regions 23, 24, and penetrate the interlayer insulating film 39 in the thickness direction Z and reach the semiconductor substrate 10. The contact holes 40 are disposed in the mesa regions 23, 24, in a linear shape extending along the first direction X and, for example, terminate at the border between the active region 1 and the edge termination region 2 (refer to FIG. 2). In the mesa regions 23, 24, the $p^-$-type base region 32, the $n^+$-type emitter region 34, and the $p^+$-type contact region 35 are exposed in the contact holes 40.

A barrier metal 41 is provided along a surface of the interlayer insulating film 39 and the front surface of the semiconductor substrate 10 exposed in the contact holes 40. The barrier metal 41 has high adhesion with a semiconductor portion (the semiconductor substrate 10) and contains a metal forming an ohmic contact with the semiconductor portion. In particular, the barrier metal 41 may be, for example, a stacked film formed by sequentially stacking a titanium (Ti) film and a titanium nitride (TiN) film. A contact plug 42 is provided on the barrier metal 41 so as to be embedded in the contact holes 40.

The contact plug 42 is, for example, a metal film containing as a material, tungsten (W) that has a high embedding property. The emitter electrode (second electrode) 43, in the active region 1, is provided at the front surface of the semiconductor substrate 10 overall. The emitter electrode 43 is electrically connected to the $p^-$-type base region 32, the $n^+$-type emitter region 34, and the $p^+$-type contact region 35 via the contact plug 42 and the barrier metal 41. The emitter electrode 43 is, for example, an aluminum-silicon (Al—Si) electrode. The emitter electrode 43 functions as the emitter pad 11.

At a rear surface side of the semiconductor substrate 10, the $n^+$-type buffer region 44 and the $p^+$-type collector region (fifth semiconductor region) 45 are provided. The $n^+$-type buffer region 44 is provided between the $n^-$-type drift region 31 and the $p^+$-type collector region 45, and spans the active region 1 and the edge termination region 2. The $p^+$-type collector region 45 is exposed at a rear surface of the semiconductor substrate 10 and is provided spanning the active region 1 and the edge termination region 2. A collector electrode (third electrode) 46 is in contact with the $p^+$-type collector region 45 and electrically connected to the $p^+$-type collector region 45.

As depicted in FIG. 6, in the edge termination region 2, a $p^+$-type region 51 is provided in the surface layer at the front surface of the semiconductor substrate 10. The $p^+$-type region 51 is provided along the border between the active region 1 and the edge termination region 2 and surrounds a periphery of the active region 1. A depth d3 of the $p^+$-type region 51 may be deeper than the depth d1 of the bottom of the trenches 36. All of the trenches 36 extend from the active region 1 to the edge termination region 2 and terminate in the $p^+$-type region 51. The edge termination structure (not depicted) is provided separated from the $p^+$-type region 51 and further outward (closer to the end of the semiconductor substrate 10) than is the $p^+$-type region 51.

Further, in the edge termination region 2, on the front surface of the semiconductor substrate 10, the emitter poly-silicon layers 13 are provided so as to cover the second gate electrodes 38*b* at the ends of the dummy trenches 36*b*. The emitter poly-silicon layers 13, at the ends of the dummy trenches 36*b*, are in contact with the second gate electrodes 38*b* and electrically connected to the second gate electrodes 38*b*. The emitter poly-silicon layers 13 are exposed at contact holes 50 that penetrate the interlayer insulating film 39 in the thickness direction Z and reach the semiconductor substrate 10.

In the contact holes 50, similarly to the contact holes 40 of the active region 1, the barrier metal 41 and the contact plug 42 are provided. The emitter electrode 43 is electrically connected to the second gate electrodes 38*b*, via the emitter poly-silicon layers 13 and, the contact plugs 42 and the barrier metal 41 in the contact holes 50. Further, in the edge termination region 2, the gate runner 15 is provided on the front surface of the semiconductor substrate 10, via the field oxide film 52.

The gate runner 15 is provided separated from the emitter poly-silicon layers 13 and closer to the ends of the semiconductor substrate 10 than are the emitter poly-silicon layers 13. The gate runner 15, at the ends of the gate trenches 36*a*, is in contact with the first gate electrodes 38*a* and electrically connected to the first gate electrodes 38*a*. At the ends of the gate trenches 36*a*, ends of the first gate electrodes 38*a* may be extended onto the field oxide film 52 and extended portions of the ends of the first gate electrodes 38*a* may be in contact with the gate runner 15.

As described above, according to the first embodiment, during turn ON, a portion of the storage region facing the dummy gate, across the second gate insulating film at the side wall of the dummy trench is inverted to a p-type and through the inversion layer, holes in the semiconductor substrate are drawn out from the dummy gate to the emitter electrode. As a result, hole density of a portion in the $n^-$-type drift region, directly beneath the storage region decreases. Therefore, the amount of hole charging to the parasitic capacitance formed by the first gate insulating film between the first gate electrode and the semiconductor during turn ON may be reduced.

Further, according to the first embodiment, the amount of hole charging to the parasitic capacitance formed by first gate insulating film is reduced, whereby rising of the gate voltage (voltage between the gate and the emitter) disappears, enabling di/dt of the current between the collector and the emitter to be reduced. As a result, for the current between the collector and the emitter, di/dt controllability by gate resistance is enhanced. Further, di/dt of the current between the collector and the emitter decreases, enabling suppression of oscillation of the waveform of the current between the collector and the emitter during turn ON.

According to the first embodiment, enhancement of di/dt controllability by gate resistance for the current between the collector and the emitter during turn ON described above and suppression of oscillation of the waveform of the current between the collector and the emitter during turn ON described above may be achieve by setting the proportion of the number of the gate trenches relative to the total number of the trenches in a range from 60% to 84%. Further, by increasing the proportion of the number of the gate trenches relative to the total number of the trenches, IE effects increase and channel density may be increased. Therefore, conduction loss may be reduced.

Figure 8:
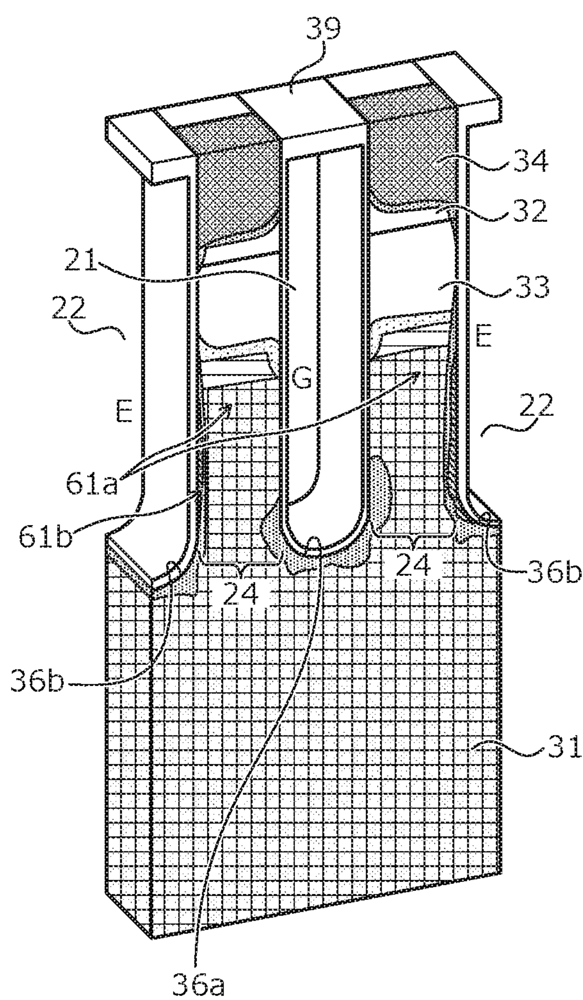
FIG. 8 is a perspective view of minority carrier density distribution in a first reference example.
Figure 9:
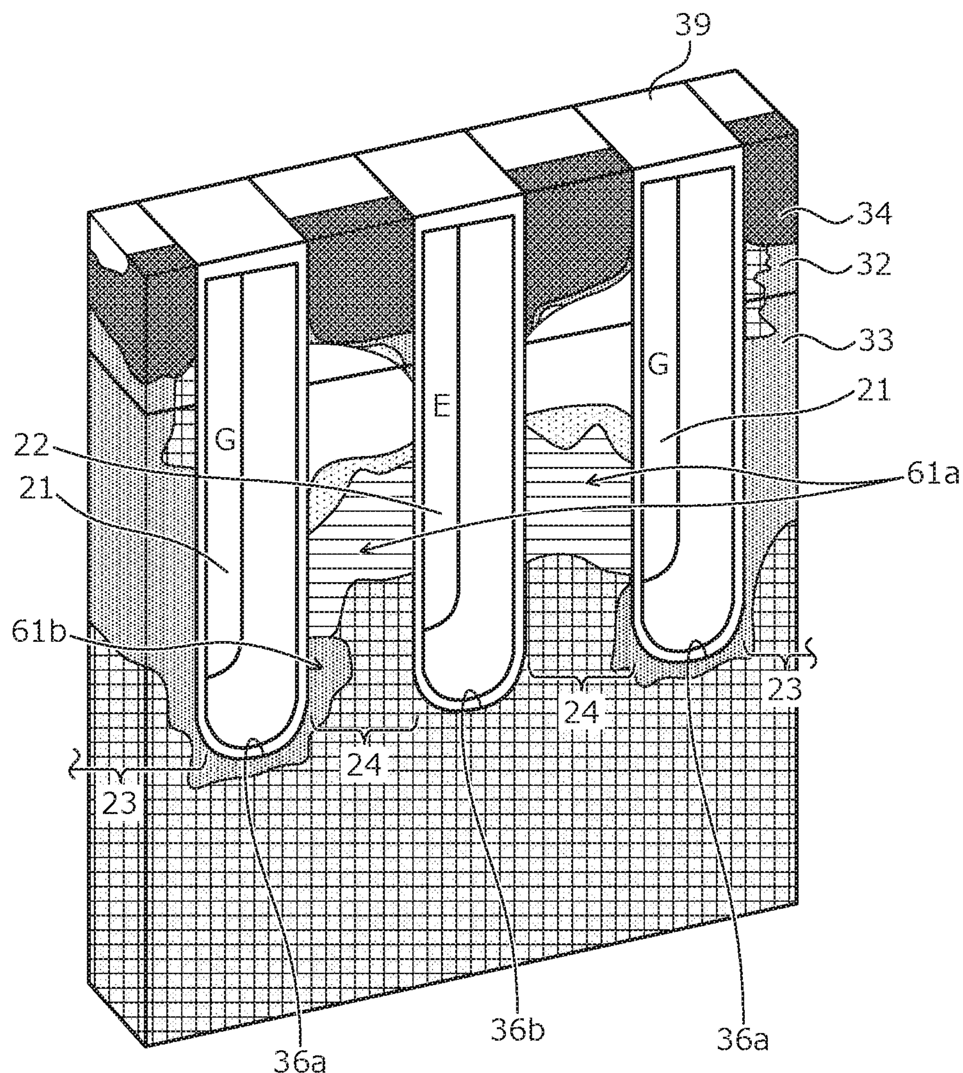
FIG. 9 is a perspective view of minority carrier density distribution in a first example.

(Experiment 1) Hole density reduction effects by the dummy gates 22 were verified. FIG. 8 is a perspective view of minority carrier density distribution in a first reference example. FIG. 9 is a perspective view of minority carrier density distribution in a first example. For two IGBTs (hereinafter, first reference example and first example) alone including the trench-gate structure having the trench gates 21 and the dummy gates 22 described above, and the storage region 33 having the impurity concentration of $5\times10^{16}/cm^3$, results of simulation of hole density in the device (in the semiconductor substrate 10) at an initial rise (interval corresponding to reference numeral 101*b*' in FIG. 18) of the current waveform of the current ICE between the collector and the emitter during turn ON are depicted in FIGS. 8 and 9, respectively.

In the first reference example and the first example depicted in FIGS. 8 and 9, the proportions of the number of the gate trenches 36*a* relative to the total number of the trenches 36 were set to 50% and 60%, respectively. In the first reference example depicted in FIG. 8, the gate trenches 36*a* and the dummy trenches 36*b* are disposed to repeatedly alternate each other in the second direction Y (in FIGS. 8, 10, 11, and 13, indicated as "50% gate ratio/with storage region"). In the first example depicted in FIG. 9, one of the dummy trenches 36*b* is disposed for every two of the gate trenches 36*a* in the second direction (in FIGS. 9 to 11, indicated as "67% gate ratio/with storage region"). Excluding the number of the gate trenches 36*a*, configuration of the reference example and the first example was the same as that of the semiconductor device 20 described above.

From the results depicted in FIGS. 8 and 9, it was confirmed that in the first reference example and the first example, holes from the dummy gates 22 are drawn out, whereby in the mesa regions 24 adjacent to the dummy trenches 36*b*, holes did not accumulate at portions 61*a* of the $n^-$-type drift region 31, directly beneath the storage regions 33. Therefore, it was confirmed that by providing the dummy gates 22 in the IGBT having the trench-gate structure, hole density near the dummy gates 22 could be suppressed.

Figure 10:
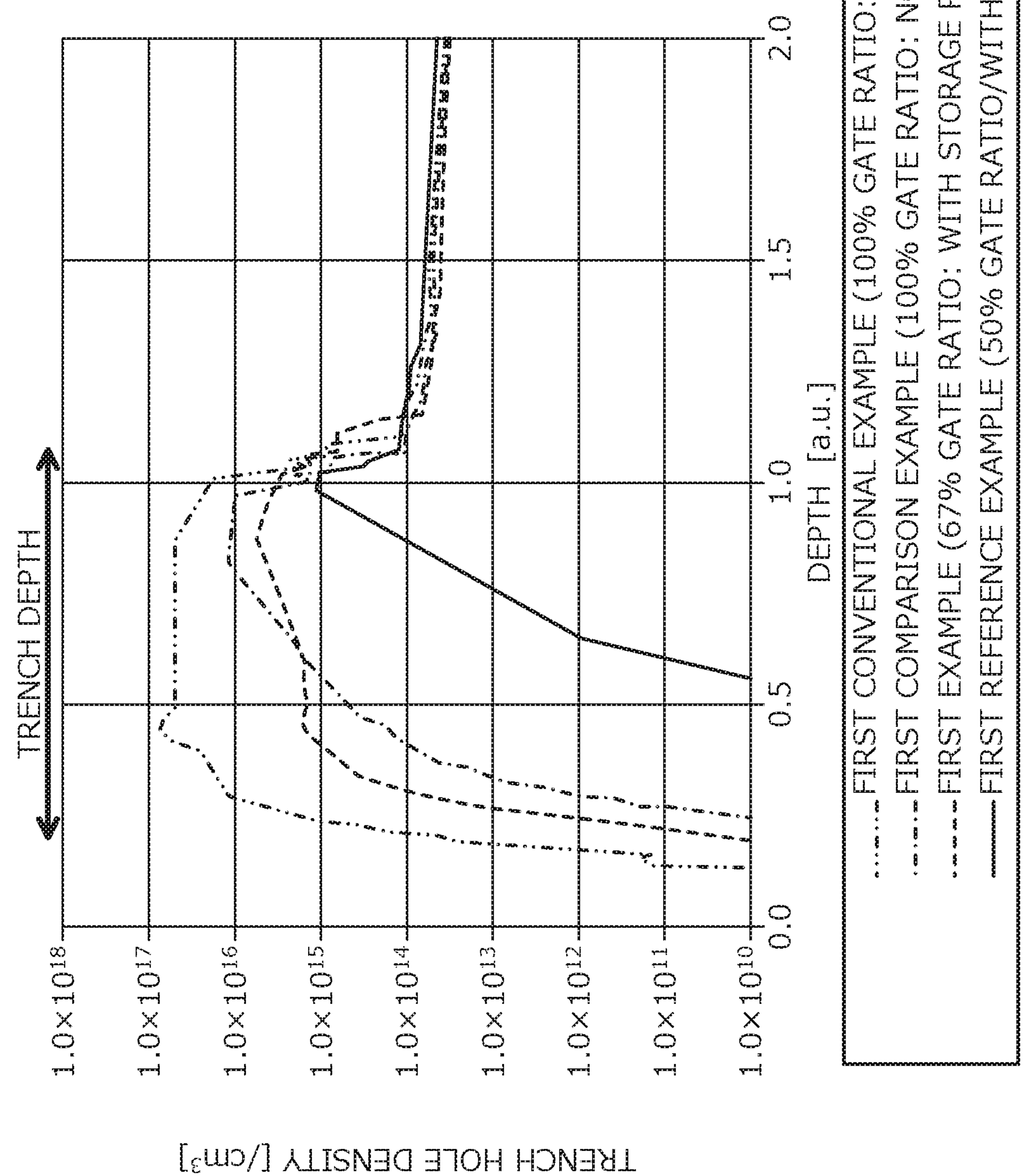
FIG. 10 is a characteristics diagram depicting hole density distribution in the first example.
Figures 11, 12:
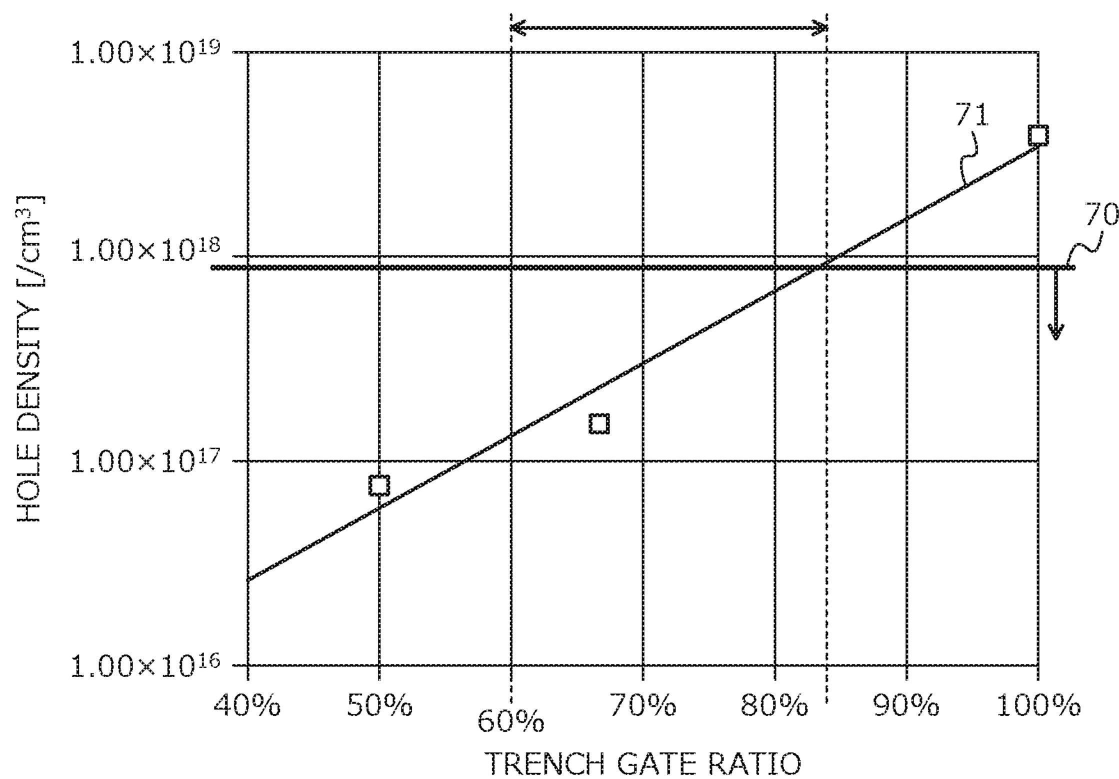
FIG. 11 is a table of integral values of hole density in the first example.
FIG. 12 is a characteristics diagram depicting a relationship between trench gate ratio and hole density in the first example.

(Experiment 2) For the first example ("67% gate ratio/with storage region") described above, results of simulation of hole density of a portion 61*b* of the first gate insulating film 37*a*, along the side wall of the gate trench 36*a* are depicted in FIGS. 10 and 11. FIG. 10 is a characteristics diagram depicting hole density distribution in the first example. FIG. 11 is a table of integral values of hole density in the first example.

In FIG. 10, a horizontal axis represents depth from the front surface of the semiconductor substrate 10, where the depth at the front surface is assumed to be 0 μm. A range indicated by a double-headed arrow in FIG. 10 indicates the depth of the gate trenches 36*a* from the front surface of the semiconductor substrate 10. FIG. 11 shows integral values of hole density at the depth of the gate trenches 36*a* from the front surface of the semiconductor substrate 10.

Further, in FIGS. 10 and 11, for the first reference example ("50% gate ratio/with storage region") described above, the first conventional example ("100% gate ratio/with storage region": refer to FIG. 19) and the first comparison example ("100% gate ratio/no storage region": structure not depicted) as well, results of simulation of hole density at same locations as in the first example (in the first reference example, corresponds to reference character 61*b* in FIG. 8, and in the first conventional example, corresponds to reference character 118*b* in FIG. 19, and not depicted in the first comparison example) are depicted.

From the results depicted in FIGS. 10 and 11, it was confirmed that in the first example, the first reference example, and the first comparison example, integral values of hole density of the portion 61*b* of the first gate insulating film 37*a*, along the side wall of the gate trench 36*a* could be reduced as compared to the first conventional example. Further, in the first example and the first reference example, it was confirmed that the hole density of the portion 61*b* of the first gate insulating film 37*a*, along the side wall of the gate trench 36*a* could be set to be equal to or less than the integral value of hole density at the same location in the first comparison example.

In the first comparison example, the storage region is not included and thus, during turn ON, the current waveform of the current ICE between the collector and the emitter does not oscillate and the controllability of di/dt by gate resistance is good for the current between the collector and the emitter. In the first example and the first reference example, the hole density of the portion 61*b* of the first gate insulating film 37*a*, along the side wall of the gate trench 36*a* is set to be equal to or less than the integral value of hole density at the same location in the first comparison example, whereby effects similar to those of the first comparison example are obtained and the IE effects may be increased by the storage regions 33.

(Experiment 3) Next, the proportion of the number of the gate trenches 36*a* relative to the total number of the trenches 36 (hereinafter, the ratio of the trench gates 21) was verified. FIG. 12 is a characteristics diagram depicting a relationship between the trench gate ratio and hole density in the first example. In FIG. 12, data points of simulation regarding the integral value of hole density of the portion 61*b* of the first gate insulating film 37*a*, along the side wall of the gate trench 36*a* in the first example ("67% gate ratio/with storage region") described above are depicted.

Further, in FIG. 12, integral values of hole density of the portions 61*b*, 118*b* of the gate insulating films 37*a*, 116 along the side walls of the gate trenches 36*a*, 115 in the first reference example ("50% gate ratio/with storage region") and the first conventional example ("100% gate ratio/with storage region") described above are depicted. In other words, in FIG. 12, data points of the integral values of hole density when the trench gate ratio is 50%, 67%, and 100% are depicted. Furthermore, in FIG. 12, an approximation straight line 71 is depicted that is calculated based on these three data points and that indicates a relationship between hole density and trench gate ratio.

From the approximation straight line 71 indicating the relationship between hole density and trench gate ratio in FIG. 12, in the invention, it was confirmed that the integral value of hole density at the portion 61*b* of the first gate insulating film 37*a*, along the side wall of the gate trench 36*a* increases proportionally to the magnitude of the ratio of the trench gates 21 as the ratio of the trench gates 21 increases. Further, it was confirmed that when the trench gate ratio was 84%, the integral value of hole density of the portion 61*b* of the first gate insulating film 37*a*, along the side wall of the gate trench 36*a* in the first example was a same as the integral value of hole density at the same location in the first comparison example (value indicated by line 70 in FIG. 12).

Therefore, in the invention, it was confirmed that in setting the integral value of hole density at the portion 61*b* of the first gate insulating film 37*a*, along the side wall of the gate trench 36*a* to be equal to or less than the integral value of hole density at the same location in the first comparison example, the ratio of the trench gates 21 suffices to be set equal to or less than 84%, which is an upper limit value of a range indicated by a double-headed arrow in FIG. 12. The range of the ratio of the trench gates 21 indicated by the double-headed arrow in FIG. 12 is a preferred range of the ratio of the trench gates 21 in the invention. A reason for setting the ratio of the trench gates 21 to be equal to or more than 60%, which is a lower limit of the range indicated by the double-headed arrow in FIG. 12 will be discussed hereinafter in a fifth example.

Figure 13:
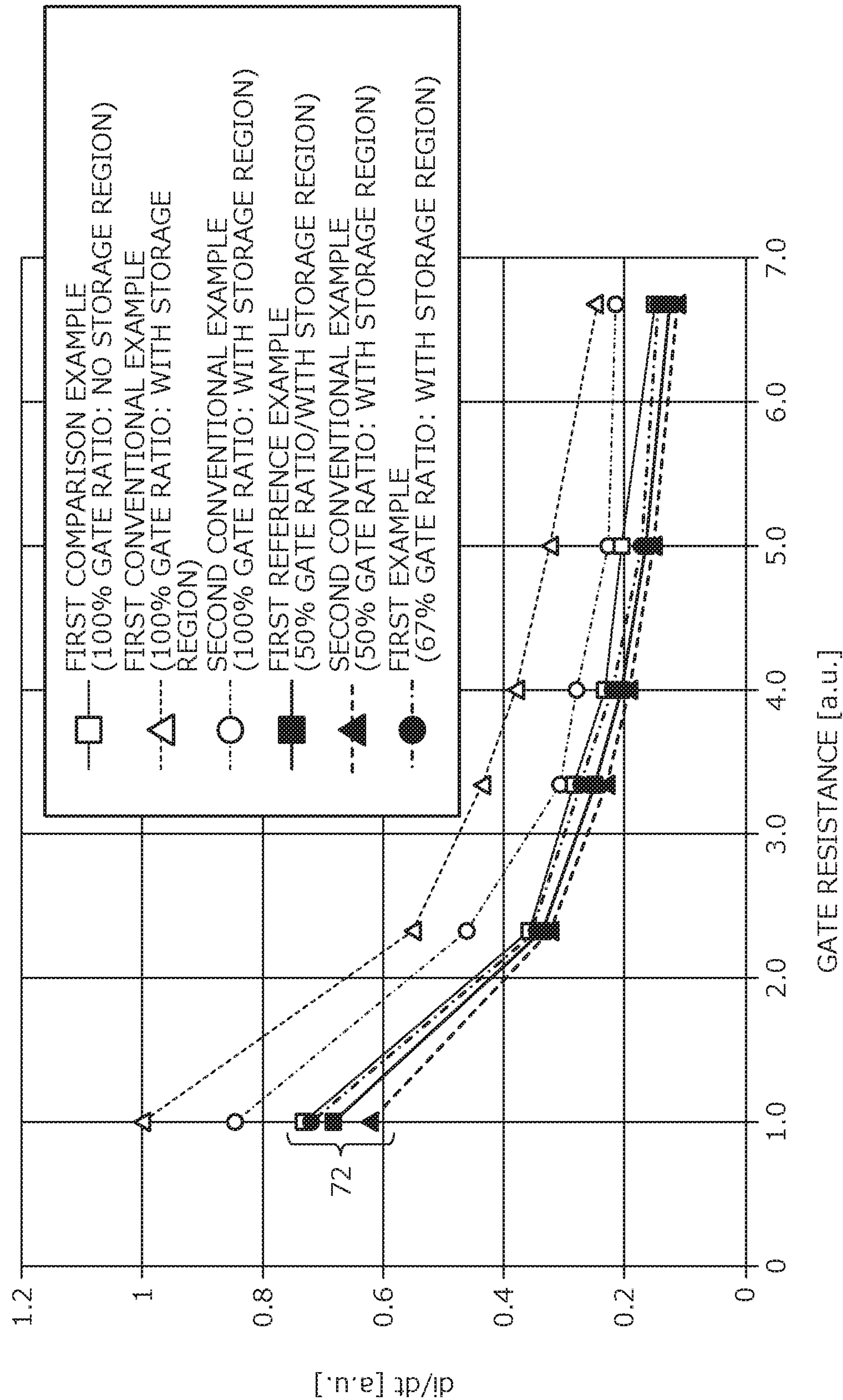
FIG. 13 is a characteristics diagram depicting a relationship between resistance value of gate resistance and di/dt of current between a collector and an emitter during turn ON in the first and fourth examples.

(Experiment 4) An approximation curve based on data points obtained by simulation regarding a relationship of the resistance value of the gate resistance and di/dt of the current between the collector and the emitter during turn ON are depicted in FIG. 13. FIG. 13 is a characteristics diagram depicting the relationship between the resistance value of the gate resistance and di/dt of the current between the collector and the emitter during turn ON in the first and fourth examples. In FIG. 13, a horizontal axis indicates resistance values of the gate resistance, and a vertical axis indicates the maximum current value of di/dt of the current between the collector and the emitter during turn ON.

In FIG. 13, results of simulation are depicted for the first example (67% gate ratio/with storage region), the first reference example (50% gate ratio/with storage region), the first comparison example (100% gate ratio/no storage region), and the first conventional example (100% gate ratio/with storage region) described above. Further, in FIG. 13, results of simulation for the second conventional example and a second reference example in which the impurity concentration of the storage region 113 alone differed from those in the first reference example and the first conventional example are depicted. The impurity concentration of the storage regions 33, 113 in the second reference example and the second conventional example was $2\times10^{16}/cm^3$.

A legend in FIG. 13 indicates that the first comparison example has "100% gate ratio/no storage region"; the first and the second conventional examples have "100% gate ratio/with storage region"; the first and the second reference examples have "50% gate ratio/with storage region"; and the first example has "67% gate ratio/with storage region".

From the results depicted in FIG. 13, in the first and the second conventional examples not including the dummy gates, it was confirmed that independent of the resistance value of the gate resistance, di/dt of the current between the collector and the emitter during turn ON was high as compared to the first comparison example having the same condition for the resistance value of the gate resistance. On the other hand, for the first example and the first and the second reference examples including the dummy gates 22, it was confirmed that independent of a resistance value of a gate resistance Rg, di/dt of the current between the collector and the emitter during turn ON could be set to about the same or lower as compared to the first comparison example having the same condition for the resistance value of the gate resistance. In FIG. 13, curves indicating characteristics of the first example, the first and the second reference examples, and the first comparison example are indicated by reference numeral 72.

Thus, in the first example and the first and the second reference examples, similarly to the first comparison example, it was confirmed that the controllability of di/dt by gate resistance was good for the current between the collector and the emitter during turn ON. Further, in the first and the second reference examples, independent of the resistance value of the gate resistance, di/dt of the current between the collector and the emitter during turn ON was low as compared to the first example having the same condition for the resistance value of the gate resistance. Therefore, it was confirmed that by reducing the impurity concentration of the storage region 33, the controllability of di/dt by gate resistance can be enhanced for the current between the collector and the emitter during turn ON. Effects obtained by reducing the impurity concentration of the storage region 33 are similarly obtained in the first example as well.

Figure 14:
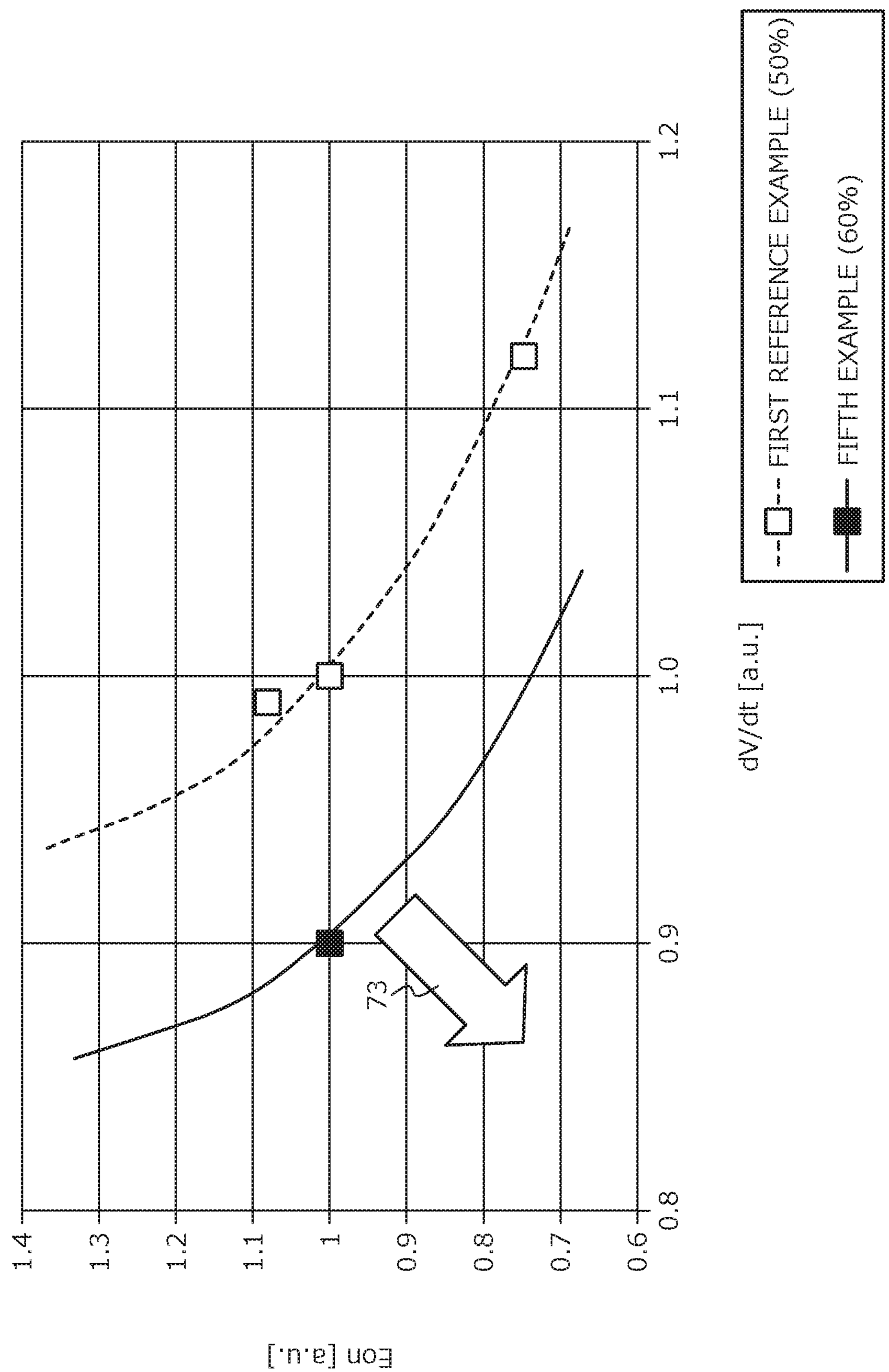

(Experiment 5) An approximation curve based on data points obtained by simulation regarding a relationship between the conduction loss Eon during turn ON and dV/dt of the voltage between the collector and the emitter during turn ON is depicted in FIG. 14. FIG. 14 is a characteristics diagram depicting a relationship between the conduction loss Eon during turn ON in the fifth example and dV/dt of the voltage between the collector and the emitter during turn ON. In FIG. 14, results of simulation of the fifth example and the first reference example described above are depicted. The fifth example is a case in which, in the first example, the ratio of the trench gates 21 is set to 60%. In parentheses in a legend in FIG. 14, the ratio of the trench gates 21 is indicated.

From the results depicted in FIG. 14, it was confirmed that in the fifth example (the ratio of the trench gates 21:60%), during turn ON, the conduction loss Eon and dV/dt of the voltage between the collector and the emitter could be reduced as compared to the first reference example (the ratio of the trench gates 21:50%). In other words, the larger is the ratio of the trench gates 21 (the further the approximation curve moves in the direction indicated by arrow 73 in FIG. 14), the smaller the conduction loss Eon and dV/dt of the voltage between the collector and the emitter during turn ON can be set.

While not depicted, it was confirmed that when the ratio of the trench gates 21 is greater than 75%, dV/dt of the voltage between the collector and the emitter during turn ON increases, and a tradeoff between the conduction loss Eon during turn ON and dV/dt of the voltage between the collector and the emitter during turn ON degrades. Therefore, when the tradeoff of the conduction loss Eon during turn ON and dV/dt of the voltage between the collector and the emitter during turn ON is considered, the ratio of the trench gates 21 may be in a range from about 60% to 75%.

Figure 15:
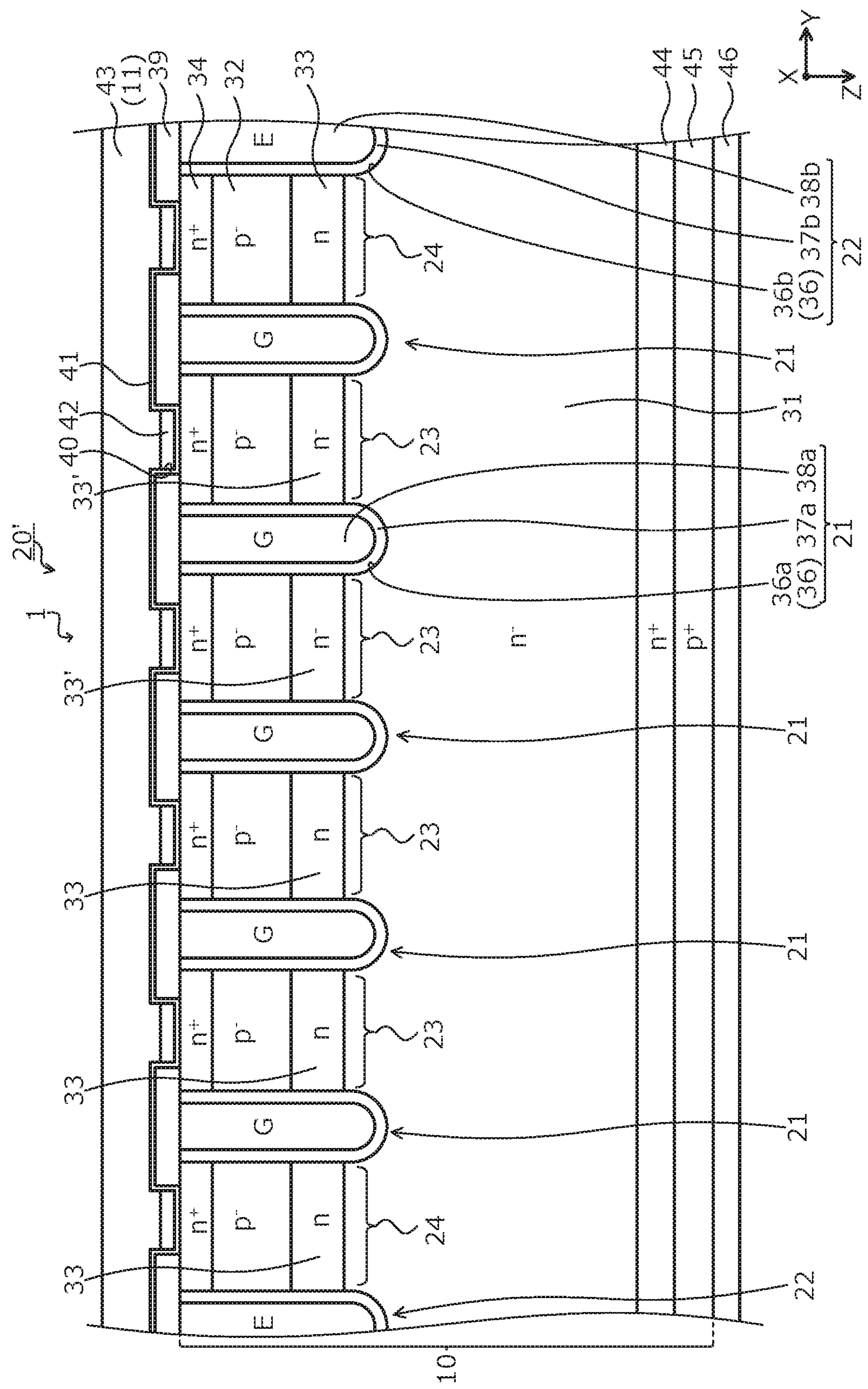
FIG. 15 is a cross-sectional view of an example of a structure of the semiconductor device according to a second embodiment.
Figure 16:
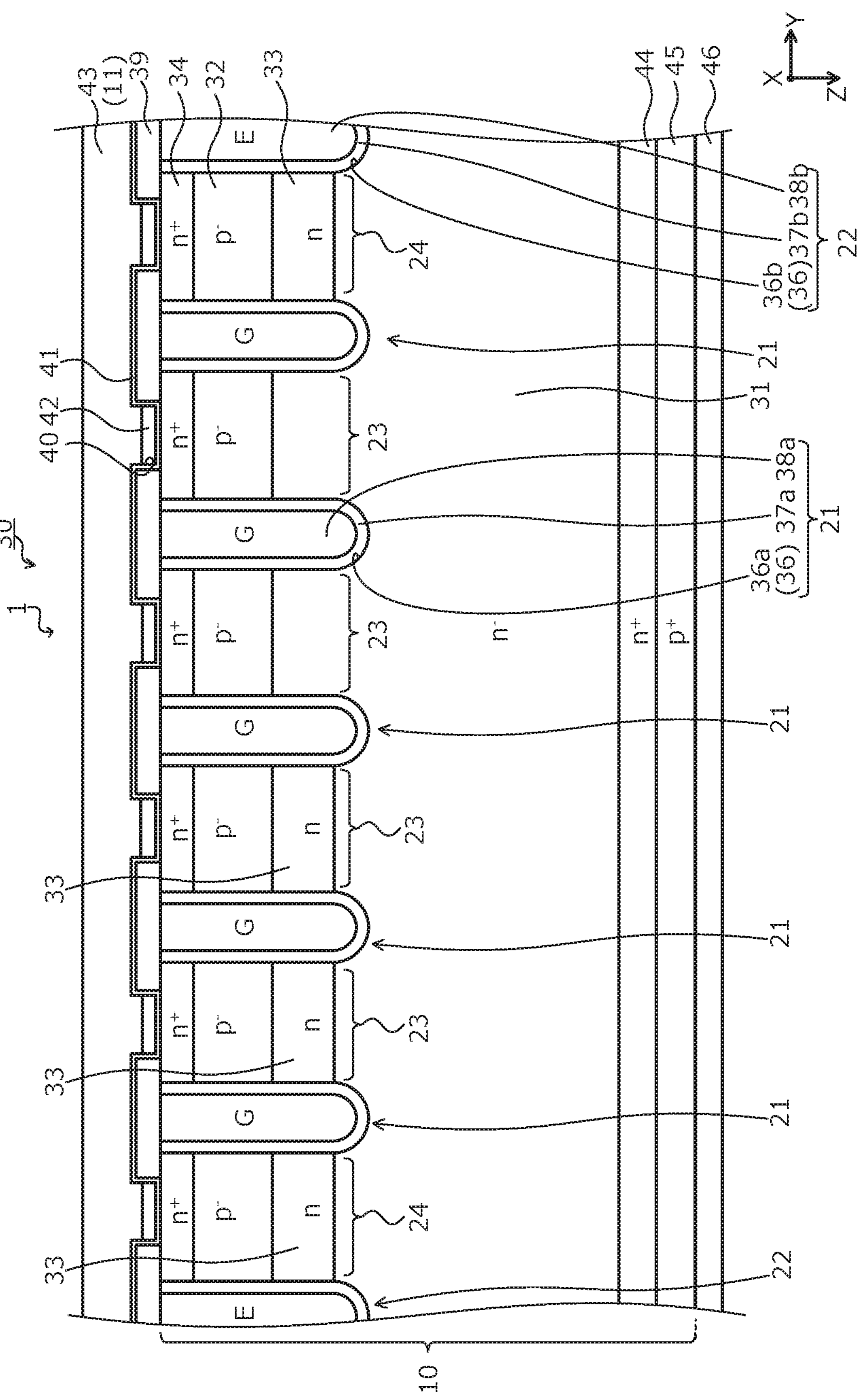
FIG. 16 is a cross-sectional view of an example of a structure of the semiconductor device according to the second embodiment.

A structure of the semiconductor device according to a second embodiment will be described. FIGS. 15 and 16 are cross-sectional views of an example of a structure of the semiconductor device according to the second embodiment. In FIGS. 15 and 16, a cross-sectional view of the structure at a location corresponding to cutting line B1-B1' in FIG. 3 is depicted. Cross-sectional views of the structure at locations corresponding to cutting line B2-B2' in FIG. 3, cutting line C1-C1' in FIG. 2, and cutting line C2-C2' in FIG. 2 have the same configurations as those in FIGS. 15 and 16 in which the storage regions 33, the gate trenches 36*a*, and the dummy trenches 36*b* in FIGS. 5 to 7 are disposed.

A semiconductor device 20' according to the second embodiment and depicted in FIG. 15 differs from the semiconductor device according to the first embodiment on the following two points. A first difference is that between the dummy trenches 36*b* adjacent to each other in the second direction Y, three or more of the gate trenches 36*a* are disposed adjacently to each other in the second direction Y. In other words, in the semiconductor device 20' according to the second embodiment and depicted in FIG. 15, the proportion of the number of the gate trenches 36*a* relative to the total number of the trenches 36 (gate ratio) is 75% or higher.

A second difference is that between the dummy trenches 36*b* that are adjacent to each other in the second direction Y, an impurity concentration of a storage region (one of two third semiconductor regions) (hereinafter, second storage region) 33' of one or more of the mesa regions 23 among two or more of the mesa regions 23 adjacent to each other in the second direction Y, is lower than the impurity concentration of the storage region (the other of the two third semiconductor regions) (hereinafter, first storage region) 33 of the remaining mesa regions 23, 24. In other words, the impurity concentration of the second storage region 33' is lower than the impurity concentration of the first storage region 33 and higher than the impurity concentration of the $n^-$-type drift region 31.

As depicted in FIG. 16, configuration may be such that between the dummy trenches 36*b* that are adjacent to each other in the second direction Y, one or more of the mesa regions 23 among two or more of the mesa regions 23 that are adjacent to each other in the second direction Y is free of the storage region 33. In other words, a semiconductor device 30 according to the second embodiment and depicted in FIG. 16 differs from the semiconductor device 20' according to the second embodiment and depicted in FIG. 15 in that the second storage region 33' is not provided.

As described above, according to the second embodiment, the impurity concentration at portions of the storage region is reduced or portions of the storage region are not provided, whereby similarly to the first embodiment, the controllability of di/dt by gate resistance may be enhanced for the current between the collector and the emitter during turn ON.

Figure 17:
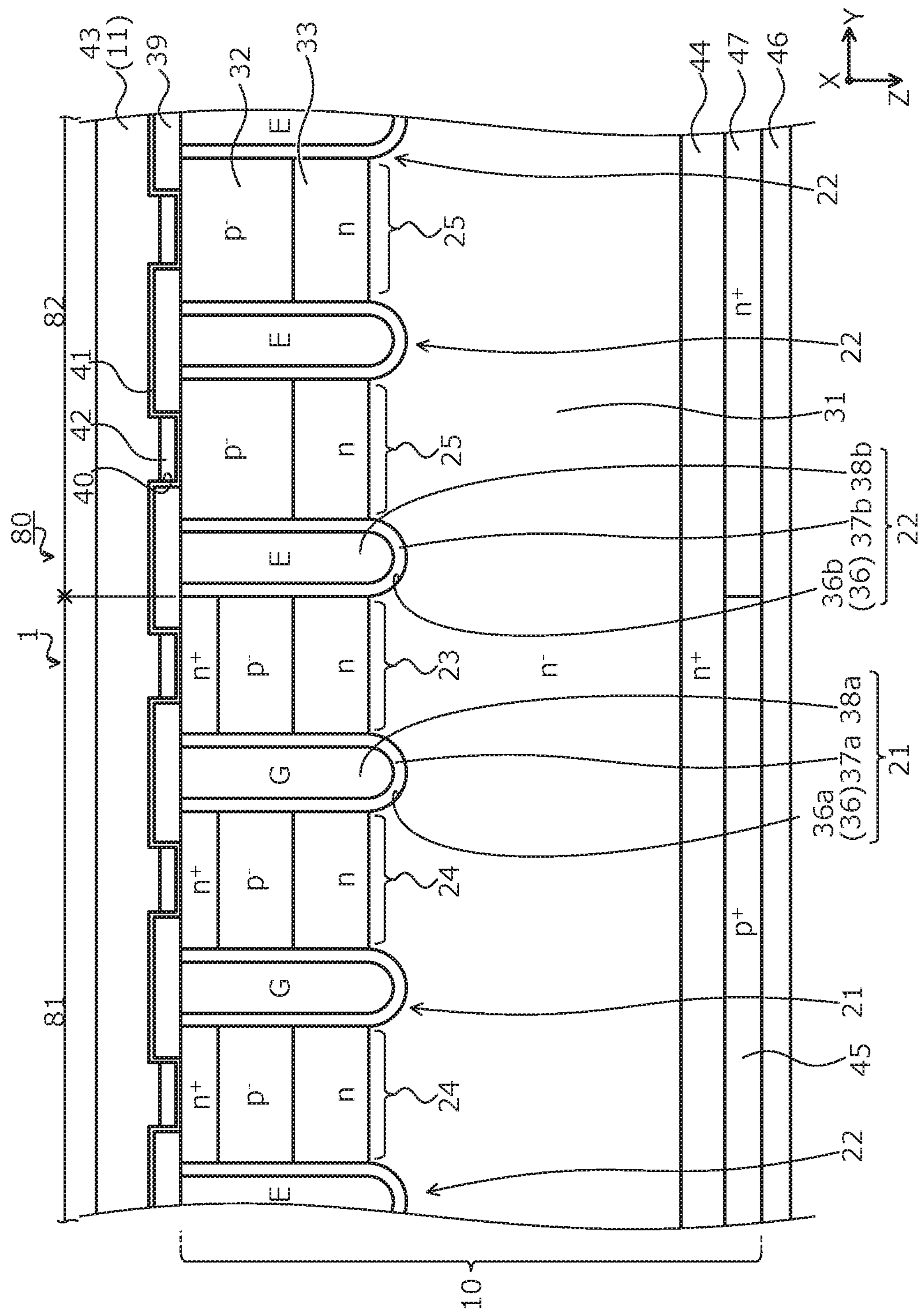
FIG. 17 is a cross-sectional view of a structure of the semiconductor device according to a third embodiment.

A structure of the semiconductor device according to a third embodiment will be described. FIG. 17 is a cross-sectional view of a structure of the semiconductor device according to the third embodiment. In a semiconductor device 80 according to the third embodiment, the semiconductor device according to the first embodiment is applied to an IGBT portion (first element region) 81 of the RC-IGBT. In the third embodiment, in the active region 1 of the semiconductor substrate 10 of an IGBT having a configuration of the semiconductor device according to the first embodiment, a diode connected in antiparallel to the IGBT is provided.

In particular, the semiconductor device 80 according to the third embodiment and depicted in FIG. 17 has in the active region 1 of the semiconductor substrate 10, the IGBT portion 81 and a diode portion (second element region) 82. In the IGBT portion 81, the IGBT is disposed. The configuration of the IGBT of the IGBT portion 81 is the same as that of the semiconductor device according to the first embodiment (refer to FIGS. 3 to 7). In the diode portion 82, the diode connected in antiparallel to the IGBT of the IGBT portion 81 is disposed.

In the diode portion 82, the dummy trenches 36*b* are disposed in a striped shape extending parallel to the trench gates 21 of the IGBT portion 81. In the dummy trenches 36*b*, similarly to the first embodiment, the second gate electrodes 38*b* of the emitter potential are provided via the second gate insulating films 37*b*; and the dummy gates 22 are configured by the dummy trenches 36*b*, the second gate insulating films 37*b*, and the second gate electrodes 38*b*.

A trench-gate structure of the diode portion 82 forms all the dummy gates 22 and therefore, as compared to a case of the IGBT alone, di/dt controllability by gate resistance is good. Therefore, in the IGBT portion 81, the proportion of the number of the gate trenches 36*a* relative to the total number of the trenches 36 may be high. The proportion of the number of the gate trenches 36*a* relative to the total number of the trenches 36 in the IGBT portion 81 is in a range from 60% to 84%.

In the diode portion 82, between (mesa region 25) the dummy trenches 36*b* that are adjacent to each other in the second direction Y, the $p^-$-type base region 32 and the storage region 33 are provided. Configuration of the $p^-$-type base region 32 and the storage region 33 in the mesa region 25 in the diode portion 82 is the same as that of the $p^-$-type base region 32 and the storage region 33 in the other mesa regions 23, 24. The $p^-$-type base region 32 in the mesa region 25 functions as an anode region.

In the mesa region 25 in the diode portion 82, the $n^+$-type emitter region 34 is not provided. While not depicted, in the mesa region 25 in the diode portion 82, the $p^+$-type contact region 35 may be provided. The $p^-$-type base region 32 in the mesa region 25 is electrically connected to the emitter electrode 43 via the barrier metal 41 and the contact plug 42, similarly to the $p^-$-type base region 32 in the other mesa regions 23, 24. The emitter electrode 43 further acts as an anode electrode.

At a rear surface side of the semiconductor substrate 10, an $n^+$-type cathode region (sixth semiconductor region) 47 is provided in the diode portion 82. The $n^+$-type cathode region 47 is provided between the rear surface of the semiconductor substrate 10 and the $n^+$-type buffer region 44, and is exposed at the rear surface of the semiconductor substrate 10. The $p^+$-type collector region 45 provided in the IGBT portion 81 and the $n^+$-type cathode region 47 are in contact with each other along the second direction Y. The collector electrode 46 is in contact with the $n^+$-type cathode region 47 and is electrically connected to the $n^+$-type cathode region 47. The collector electrode 46 further acts as a cathode electrode.

The second embodiment may be applied to the semiconductor device 80 according to the third embodiment and a layout of the storage region 33 may be changed.

As described above, according to the third embodiment, even when the semiconductor device according to the first embodiment is applied to an RC-IGBT, effects similar to those of the first embodiment may be obtained for the IGBT configuring the RC-IGBT. As a result, during turn ON, at a portion of the IGBT portion separated from the diode portion, the current waveform of the current ICE between the collector and the emitter of an IGBT cell (functional unit of the IGBT) may be suppressed from oscillating.

In the foregoing, the present invention is not limited to the embodiments described above and various modifications within a range not departing from the spirit of the invention are possible. For example, disposal of the $n^+$-type emitter region and the $p^+$-type contact region may be variously changed, and a mesa region in which the $n^+$-type emitter region is disposed so as to reach the side wall of only one of adjacent trenches may be present. Further, in the embodiments described above, while an IGBT alone or an RC-IGBT has been described, without limitation hereto, application is possible to a semiconductor device having an IGBT portion in which an IGBT is disposed. Further, the present invention is similarly implemented when conductivity types (n-type, p-type) are reversed.

The semiconductor device according to the embodiments of the present invention achieve an effect in that di/dt controllability for the current between the collector and the emitter during turn ON may be improved and oscillation may be suppressed.

As described, the semiconductor device according to the present invention is useful for power semiconductor devices used in power converting equipment and power supply devices in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:

a first semiconductor region of a first conductivity type, provided in a semiconductor substrate;

a second semiconductor region of a second conductivity type, provided in the semiconductor substrate closer to a front surface of the semiconductor substrate than is the first semiconductor region, the second semiconductor region having a front side at the front surface of the semiconductor substrate and a rear side facing the first semiconductor region;

a third semiconductor region of the first conductivity type, provided in the semiconductor substrate at the rear side of the second semiconductor region, the third semiconductor region having an impurity concentration higher than an impurity concentration of the first semiconductor region;

a fourth semiconductor region of the first conductivity type, selectively provided in the second semiconductor region;

a fifth semiconductor region of the second conductivity type, provided in the semiconductor substrate closer to a rear surface of the semiconductor substrate than is the first semiconductor region, the fifth semiconductor region being in contact with the first semiconductor region;

a plurality of trenches penetrating the fourth semiconductor region and the second semiconductor region, and reaching the first semiconductor region, the plurality of trenches being disposed at predetermined intervals in a range of 0.7 μm to 2 μm, the plurality of trenches including a plurality of gate trenches and a plurality of dummy trenches;

a plurality of first electrodes provided in the plurality of trenches via insulating films, the plurality of first electrodes including a plurality of dummy gate electrodes, each of which is provided in a corresponding one of the dummy trenches, and a plurality of gate electrodes each having a gate potential, each of the gate electrodes being provided in a corresponding one of the gate trenches, a total number of the gate electrodes being in a range of 60% to 84% of a total number of the first electrodes;

a second electrode electrically connected to the second semiconductor region, the fourth semiconductor region and the dummy gate electrodes;

a third electrode electrically connected to the fifth semiconductor region; and an additional semiconductor region of the second conductivity type, wherein the range of the total number of the gate electrodes with respect to the total number of the first electrodes is set greater with increase in a total thickness of continuously stacked first conductivity regions below the second semiconductor region in the semiconductor substrate including the first and third semiconductor regions, the plurality of gate trenches and the plurality of dummy trenches each extend in a first direction so at to be parallel to one another, and each of the plurality of dummy trenches does not face any one of the plurality of gate trenches in the first direction in a plan view of the semiconductor device, the plurality of gate trenches includes a plurality of pairs of adjacent gate trenches, and the adjacent gate trenches included in each pair are connected to each other at ends thereof so as to form a loop-shape structure, all the plurality of dummy trenches are formed outside the loop-shape structure of any of the pairs of adjacent gate trenches included in the plurality of gate trenches, the semiconductor device includes an active region and an edge termination region surrounding a periphery of the active region, the additional semiconductor region is provided at a border between the active region and the edge termination region, and connected ends of the adjacent gate trenches included in each pair that forms the loop-shape structure are located in an area where the additional semiconductor region is provided.

2. The semiconductor device according to claim 1, wherein an impurity concentration of the third semiconductor region is in a range of $2\times10^{14}/cm^3$ to $5\times10^{16}/cm^3$.

3. The semiconductor device according to claim 1, wherein the total number of the gate electrodes is in a range of 75% to 84% of the total number of the first electrodes, the third semiconductor region includes two third semiconductor regions, one of the two third semiconductor regions having an impurity concentration lower than an impurity concentration of the other of the two third semiconductor regions, the other one of the two third semiconductor regions is disposed between one of the gate trenches and one of the dummy trenches that are adjacent to each other, and two adjacent gate trenches among the plurality of gate trenches has the one of the two third semiconductor regions disposed therebetween.

4. The semiconductor device according to claim 1, wherein the total number of the gate electrodes is in a range of 75% to 84% of the total number of the first electrodes, the plurality of gate trenches include two adjacent gate trenches that are disposed between two adjacent dummy trenches among the plurality of dummy trenches, and the third semiconductor region is absent from between the two adjacent gate trenches.

5. The semiconductor device according to claim 1, wherein a depth of a bottom of the third semiconductor region measured from the front surface of the semiconductor substrate in a direction perpendicular to the front surface of the semiconductor substrate is between respective depths of a bottom of the second semiconductor region and a bottom of the plurality of trenches.

6. The semiconductor device according to claim 1, comprising in the semiconductor substrate, a first element region, and a first element disposed in the first element region; and a second element region, and a second element disposed in the second element region, the second element region being adjacent to the first element region, wherein the first element includes: the first semiconductor region, the second semiconductor region, the third semiconductor region, the fourth semiconductor region, the fifth semiconductor region, the gate trenches, the dummy trenches, the gate electrodes, the dummy gate electrodes, the second electrode, and the third electrode, and the second element includes:

the first semiconductor region, the second semiconductor region, the third semiconductor region, the dummy trenches, the dummy gate electrodes, the second electrode, and the third electrode, and a sixth semiconductor region of the first conductivity type, the sixth semiconductor region being provided in the semiconductor substrate closer to the rear surface of the semiconductor substrate than is the first semiconductor region, the sixth semiconductor region being in contact with the first semiconductor region and being electrically connected to the third electrode, the sixth semiconductor region having an impurity concentration higher than that of the first semiconductor region.

7. The semiconductor device according to claim 1, further comprising a seventh semiconductor region of the first conductivity type, provided in the semiconductor substrate between the first semiconductor region and the fifth semiconductor region, the seventh semiconductor region being in contact with the first semiconductor region and having an impurity concentration higher than the impurity concentration of the first semiconductor region, the stacked first conductivity regions including the seventh semiconductor region.

8. The semiconductor device according to claim 1, wherein said each of the plurality of gate trenches faces an adjacent one of the plurality of trenches only in a second direction orthogonal to the first direction and parallel to the front surface of the semiconductor substrate in the plan view.

9. The semiconductor device according to claim 1, wherein the third semiconductor region is a charge storage region for storing charge that is minority carriers during an ON state of the semiconductor device, and the range of the total number of the gate electrodes is set 60% to 84% of the total number of the first electrodes so that a controllability of di/dt of a current between the second electrode and the third electrode during the ON state is set approximately the same as a semiconductor device that is free of the charge storage region and the dummy gate electrodes.

10. The semiconductor device according to claim 1, wherein an impurity concentration of the second semiconductor region is lower than an impurity concentration of the additional semiconductor region.

11. The semiconductor device according to claim 1, wherein a bottom of the additional semiconductor region is farther from the front surface of the semiconductor substrate than are bottoms of the adjacent gate trenches in a depth direction orthogonal to the front surface of the semiconductor substrate.

* * * * *